(12) United States Patent
Lee

(10) Patent No.: US 9,490,160 B2
(45) Date of Patent: Nov. 8, 2016

(54) METHOD OF MANUFACTURING SEMICONDUCTOR DEVICE

(71) Applicant: SAMSUNG ELECTRONICS CO., LTD., Suwon-si, Gyeonggi-do (KR)

(72) Inventor: Dong-Jin Lee, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 345 days.

(21) Appl. No.: 14/178,959

(22) Filed: Feb. 12, 2014

(65) Prior Publication Data

US 2014/0248756 A1 Sep. 4, 2014

(30) Foreign Application Priority Data

Mar. 4, 2013 (KR) .................. 10-2013-0022903

(51) Int. Cl.
*H01L 21/76* (2006.01)
*H01L 21/762* (2006.01)
*H01L 27/115* (2006.01)

(52) U.S. Cl.
CPC ....... *H01L 21/76237* (2013.01); *H01L 27/115* (2013.01)

(58) Field of Classification Search
CPC ...................................................... H01L 21/76
See application file for complete search history.

(56) References Cited

U.S. PATENT DOCUMENTS

| 5,770,504 A | 6/1998 | Brown et al. |
| 6,100,153 A | 8/2000 | Nowak et al. |
| 7,544,582 B2 | 6/2009 | Jung |
| 2012/0003809 A1 | 1/2012 | Kim |

FOREIGN PATENT DOCUMENTS

| JP | 2012 191053 | | 10/2012 |
| JP | 2012191053 A | * | 10/2012 |
| KR | 10 2005 0030795 | | 3/2005 |
| KR | 10 0567878 | | 7/2005 |
| KR | 20050069200 A | * | 7/2005 |
| KR | 10 2006 0009422 | | 1/2006 |
| KR | 10 1024654 | | 2/2010 |
| KR | 10 2010 0078512 | | 7/2010 |
| KR | 10 2011 0108887 | | 10/2011 |
| KR | 10 2011 0121163 | | 11/2011 |

* cited by examiner

*Primary Examiner* — Marvin Payen
(74) *Attorney, Agent, or Firm* — Lee & Morse, P.C.

(57) ABSTRACT

A method of manufacturing a semiconductor device, the method including providing a substrate; forming a field trench in the substrate; and forming a diffusion barrier region under the field trench, wherein the diffusion barrier region includes carbon.

20 Claims, 40 Drawing Sheets

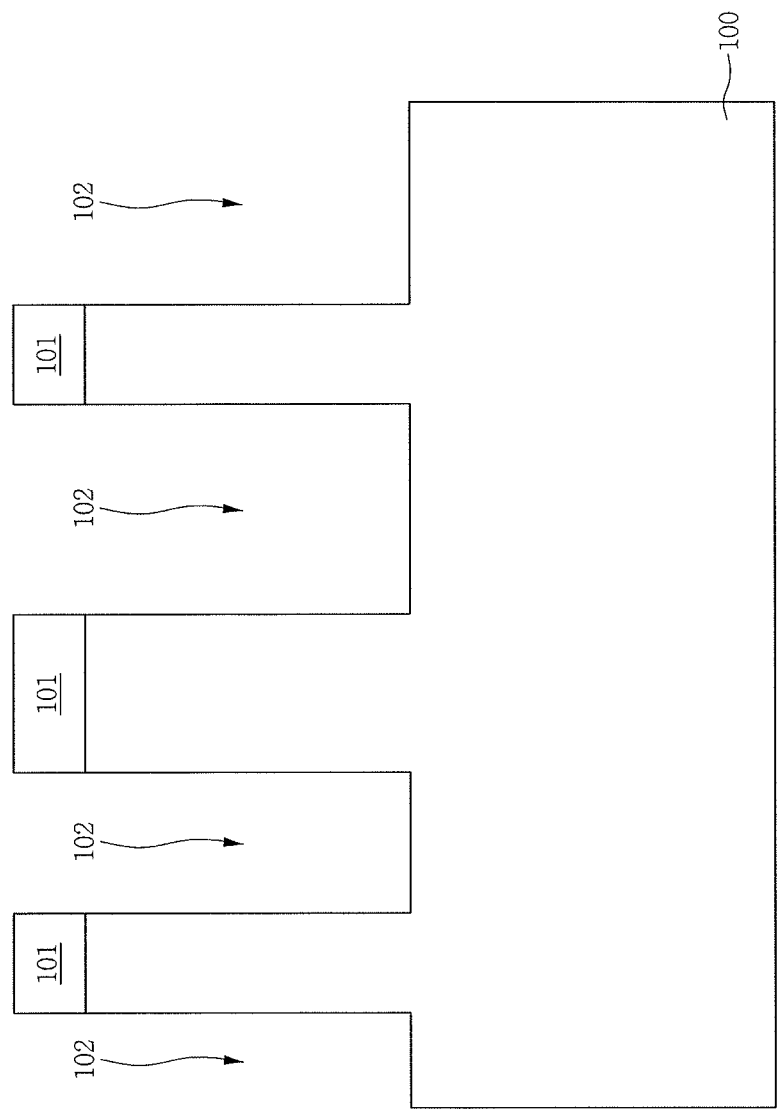

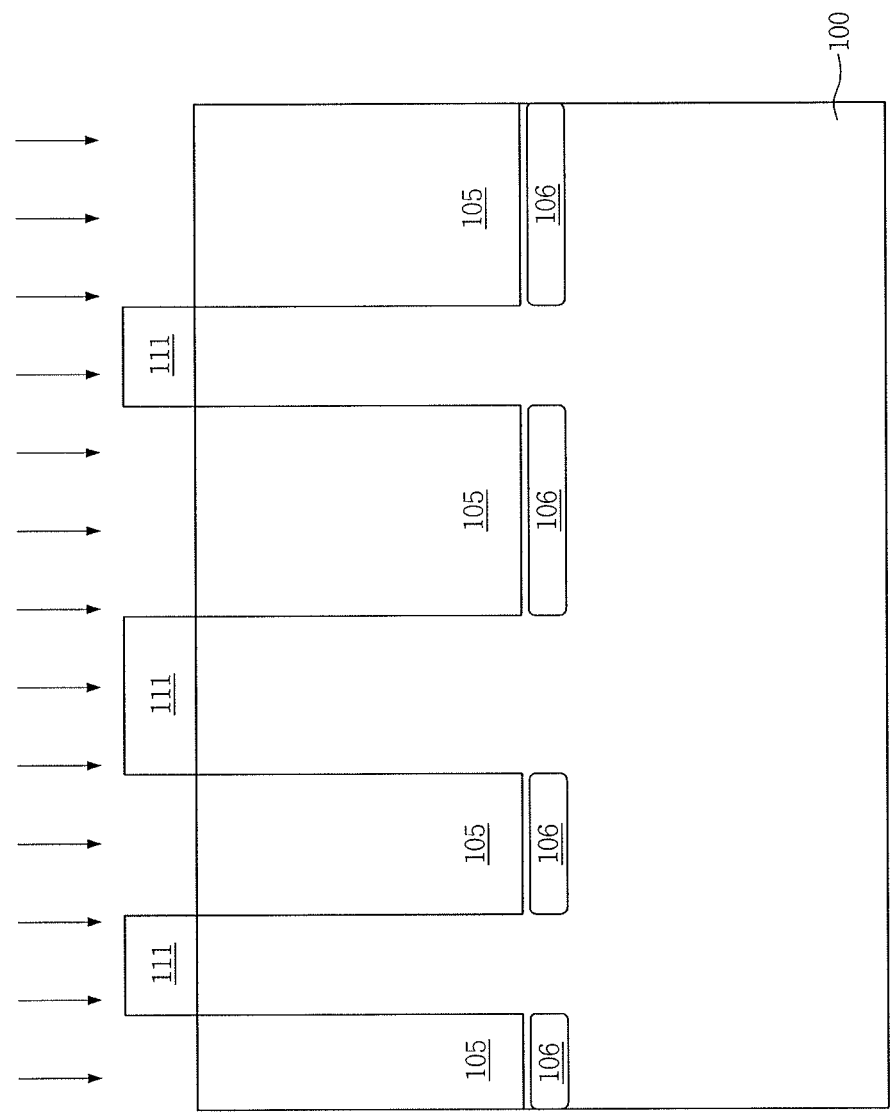

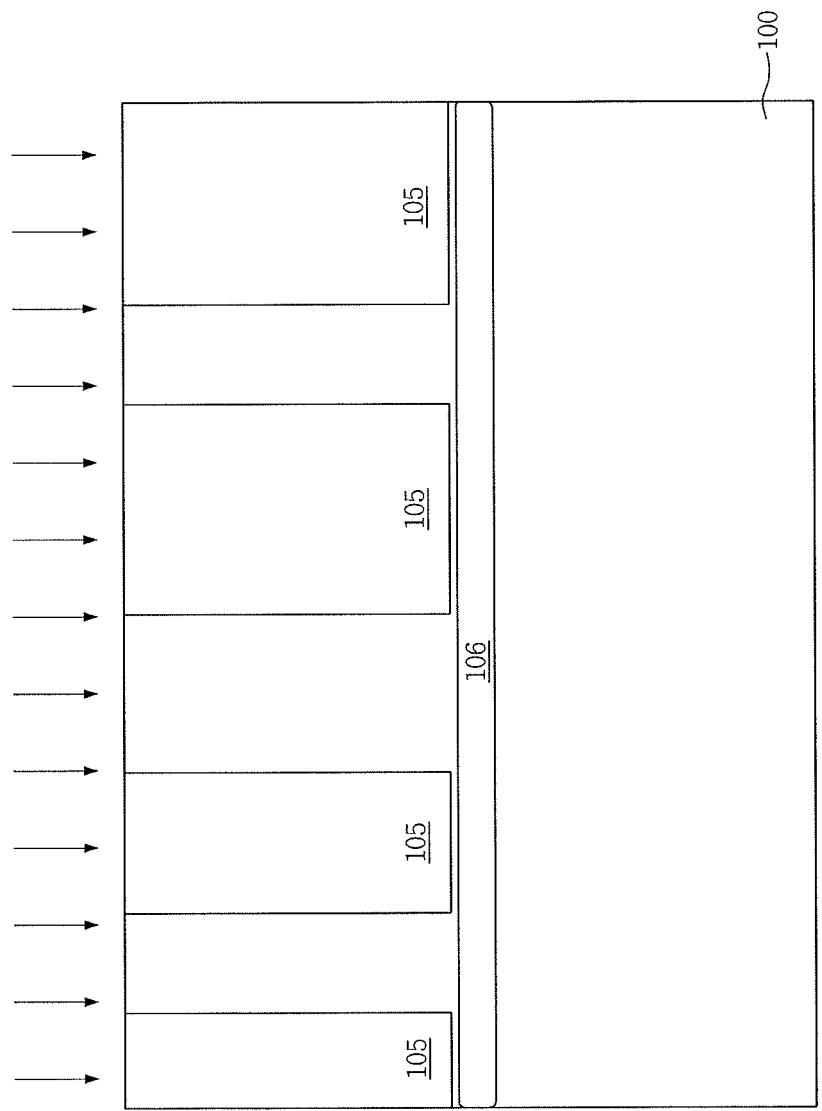

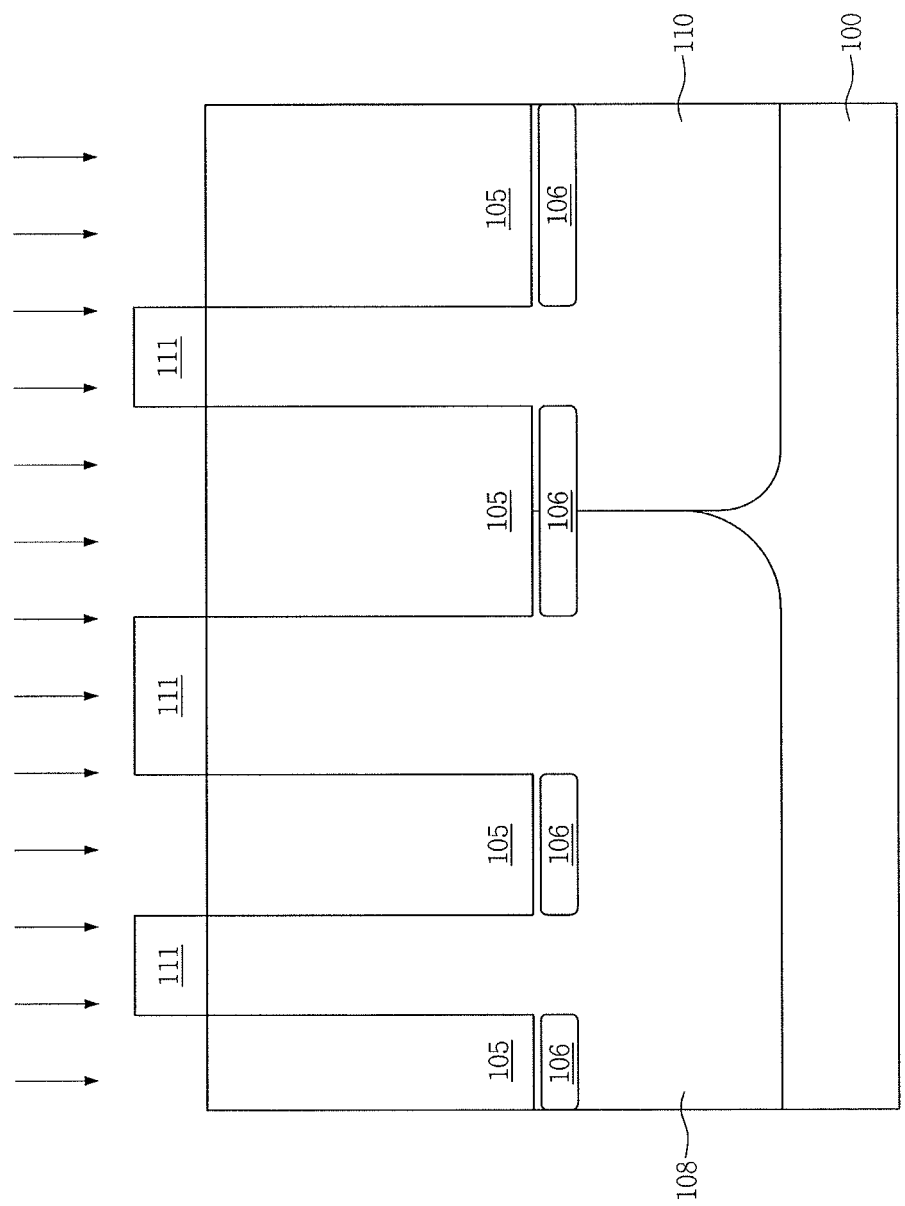

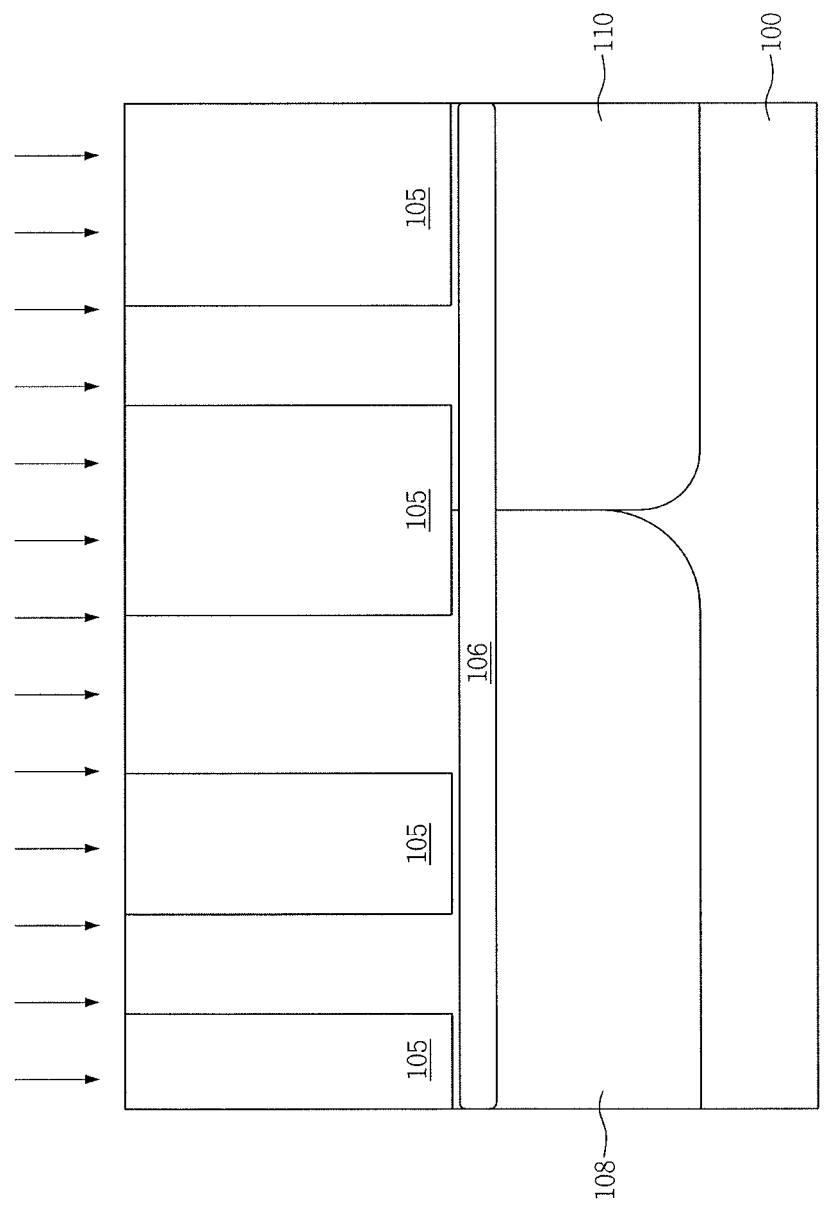

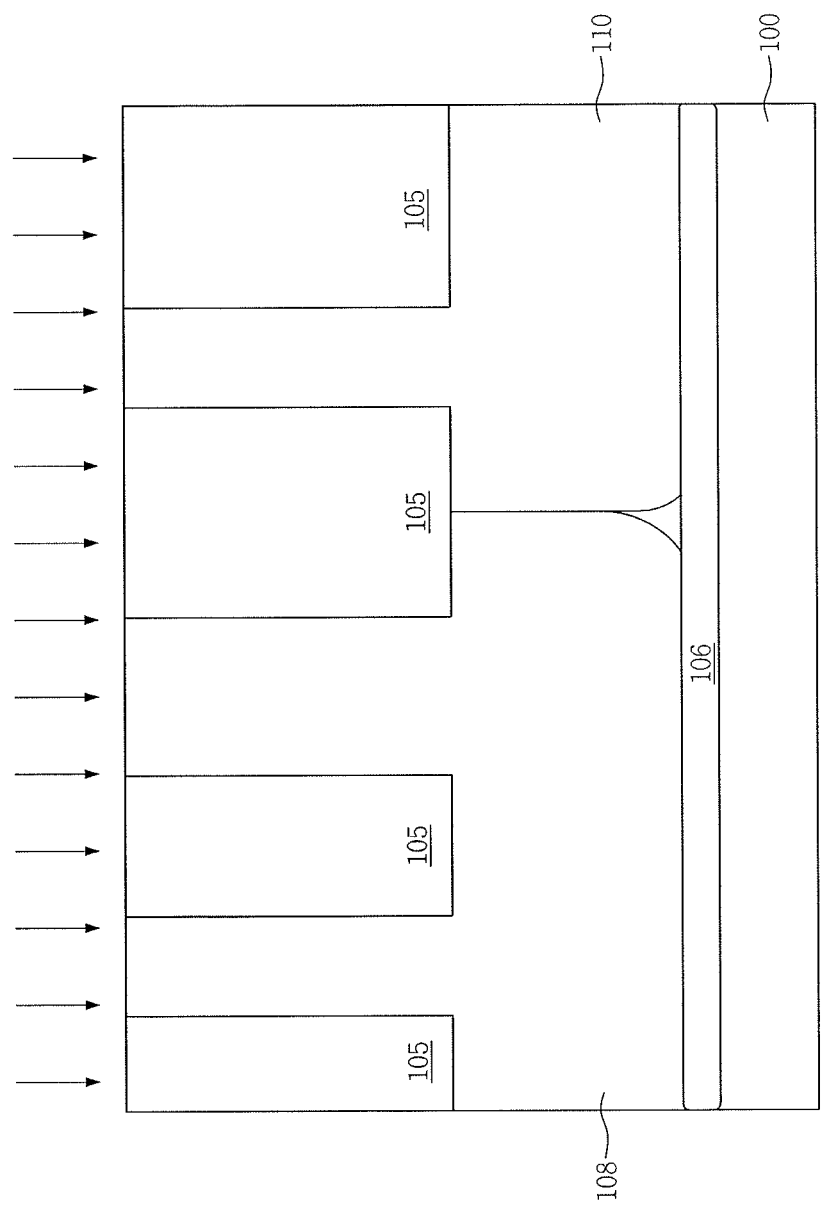

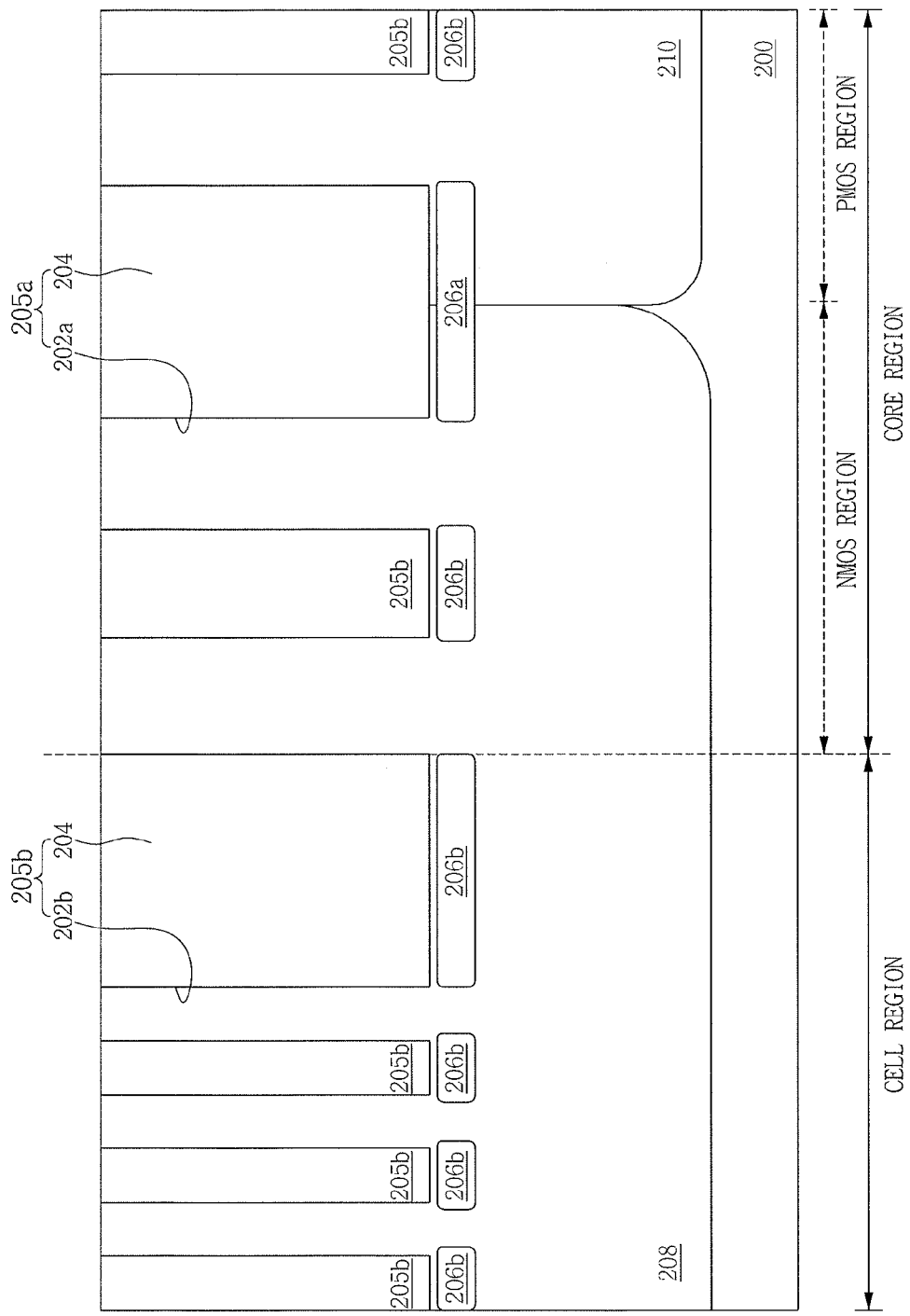

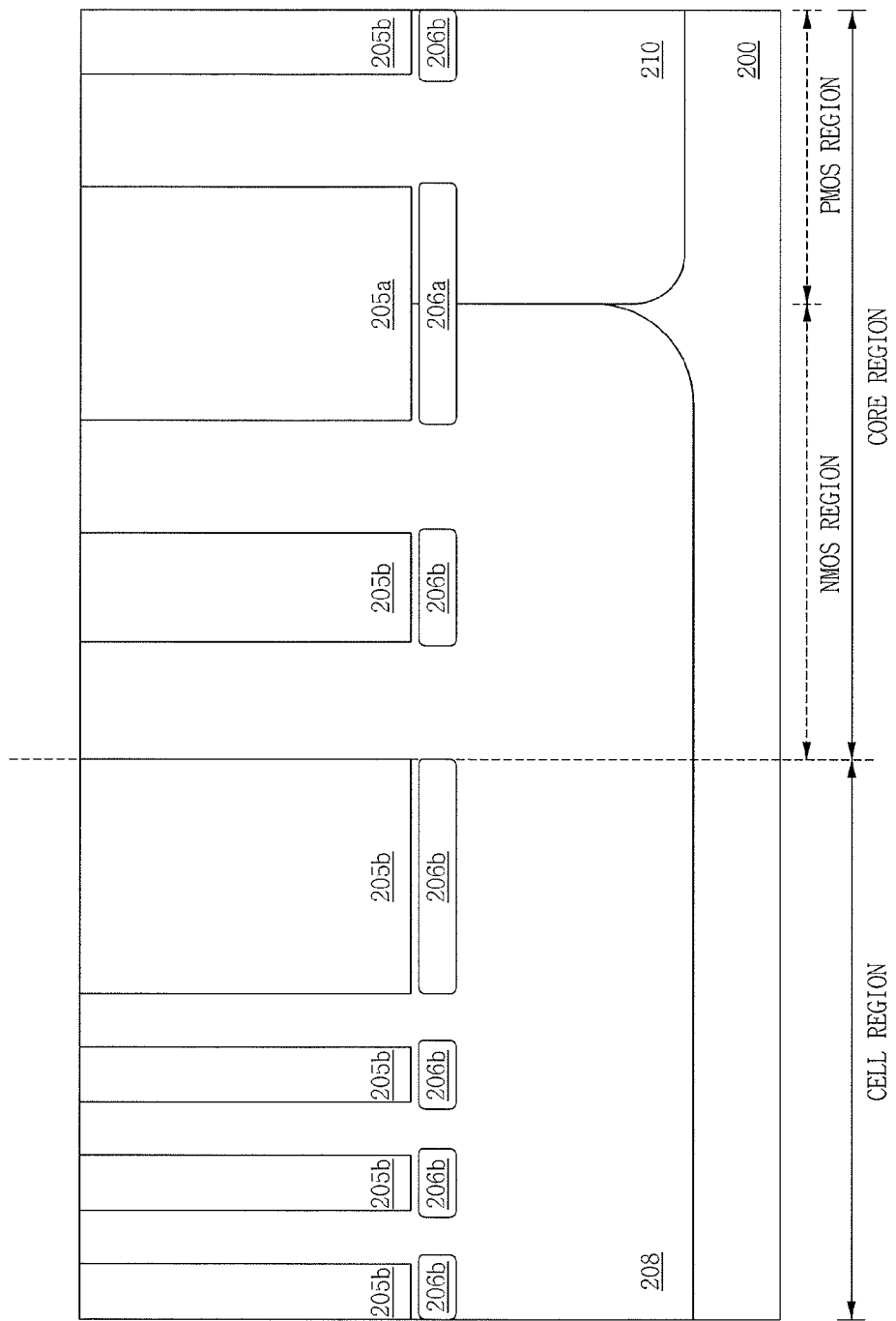

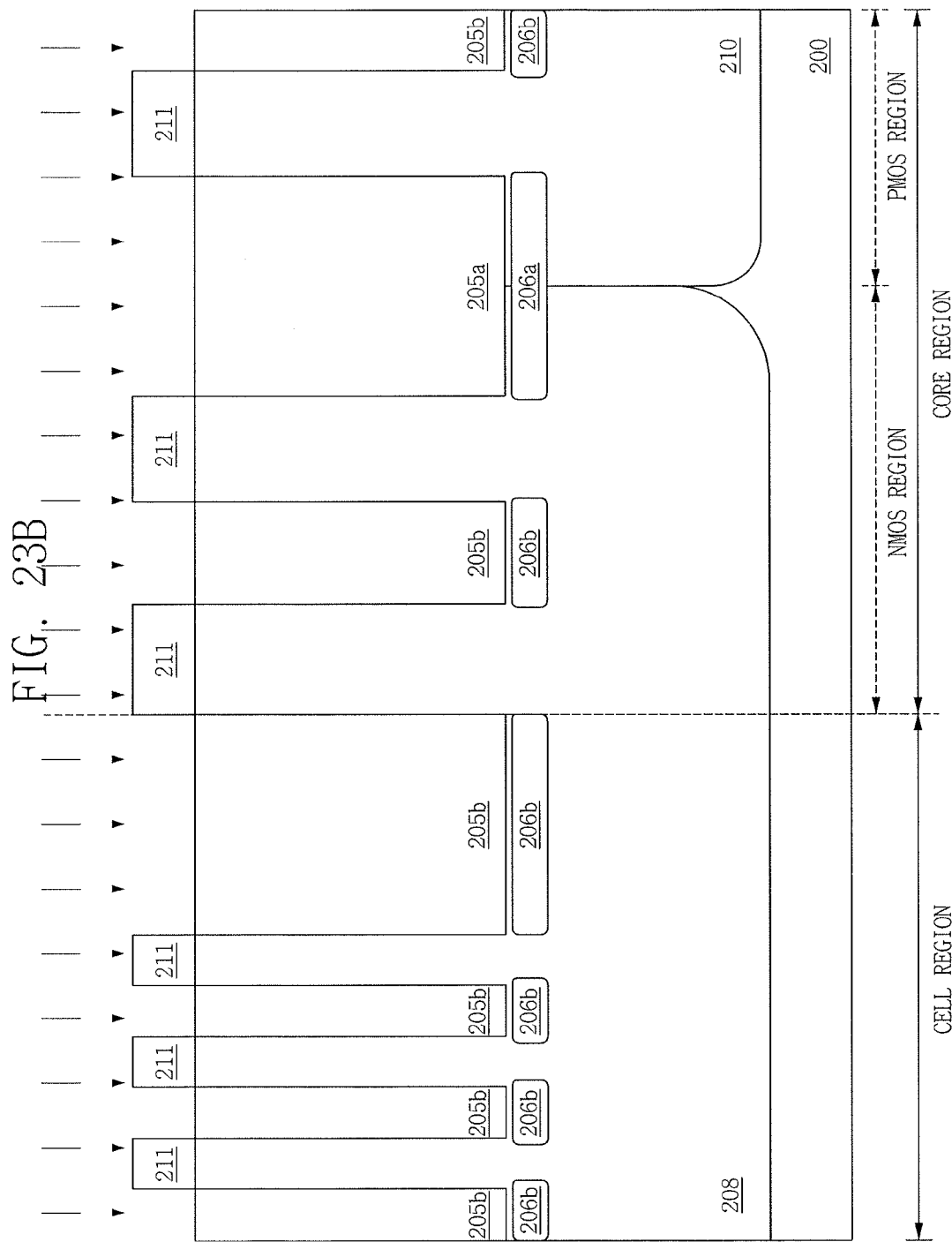

METHOD OF MANUFACTURING SEMICONDUCTOR DEVICE

CROSS-REFERENCE TO RELATED APPLICATION

Korean Patent Application No. 10-2013-0022903, filed on Mar. 4, 2013, in the Korean Intellectual Property Office, and entitled: "Method of Manufacturing Semiconductor Device," is incorporated by reference herein in its entirety.

BACKGROUND

1. Field

Embodiments relate to a method of manufacturing a semiconductor device.

2. Description of Related Art

As integration of a semiconductor device increases, a design rule of components of the semiconductor device may decrease. Device isolation characteristics may be degraded due to leakage current between components of the semiconductor devices.

SUMMARY

Embodiments are directed to a method of manufacturing a semiconductor device.

The embodiments may be realized by providing a method of manufacturing a semiconductor device, the method including providing a substrate; forming a field trench in the substrate; and forming a diffusion barrier region under the field trench, wherein the diffusion barrier region includes carbon.

The diffusion barrier region may further include germanium.

The method may further include, after forming the diffusion barrier region forming a trench isolation region by filling the field trench with an insulating layer; and forming a well region in the substrate.

The method may further include forming a trench isolation region by filling the field trench with an insulating layer before forming the diffusion barrier region; and forming a well region in the substrate after forming the diffusion barrier region.

Forming the diffusion barrier region may include forming a mask pattern exposing the trench isolation region on the substrate; and forming the diffusion barrier region under the trench isolation region, using the mask pattern as an ion-implantation mask.

The method may further include, before forming the diffusion barrier region forming a trench isolation region by filling the field trench with an insulating layer; and forming a well region in the substrate.

The diffusion barrier region may be formed under the well region.

The diffusion barrier region may be formed to extend over the entire surface of the substrate.

The embodiments may also be realized by providing a method of manufacturing a semiconductor device, the method including providing a substrate including an NMOS region and a PMOS region; forming a first field trench and second field trenches in the substrate corresponding to between the NMOS region and the PMOS region, and corresponding to the NMOS region and the PMOS region; and forming a first diffusion barrier region under the first field trench, wherein the first diffusion barrier region includes carbon.

The method may further include forming second diffusion barrier regions under the second field trenches simultaneously with the forming the first diffusion barrier region under the first field trench.

The second diffusion barrier region may include carbon.

The first and second diffusion barrier regions may further include germanium.

The method may further include, after forming the first diffusion barrier region forming a first trench isolation region and second trench isolation regions by filling the first field trench and the second field trenches with an insulating layer; and forming a P-well and an N-well in the substrate corresponding to the NMOS region and the PMOS region.

The method may further include forming a first trench isolation region and second trench isolation regions by filling the first field trench and the second field trenches with an insulating layer; before forming the first diffusion barrier region; and forming a P-well and an N-well in the substrate corresponding to the NMOS region and the PMOS region, after forming the first diffusion barrier region.

The method may further include, before forming the first diffusion barrier region forming a first trench isolation region and second trench isolation regions by filling the first field trench and the second field trenches with an insulating layer; and forming a P-well and an N-well in the substrate corresponding to the NMOS region and the PMOS region.

The first diffusion barrier region may be formed to extend over an entire surface of the substrate.

The embodiments may also be realized by providing a method of manufacturing a semiconductor device, the method including providing a substrate, the substrate including a cell region and a core region; forming a first field trench in the core region of the substrate; forming a second field trench in the cell region of the substrate; and forming a first diffusion barrier region under the first field trench, wherein the first diffusion barrier region includes carbon.

The method may further include forming a second diffusion barrier region under the second field trench simultaneously with the forming the first diffusion barrier region under the first field trench.

The second diffusion barrier region may include carbon.

The first and second diffusion barrier regions may further include germanium.

BRIEF DESCRIPTION OF THE DRAWINGS

Features will be apparent to those of skill in the art by describing in detail exemplary embodiments with reference to the attached drawings in which:

FIGS. 14A to 25 illustrate cross-sectional views of stages in a method of manufacturing semiconductor devices in accordance with various embodiments;

DETAILED DESCRIPTION

Figure 1:
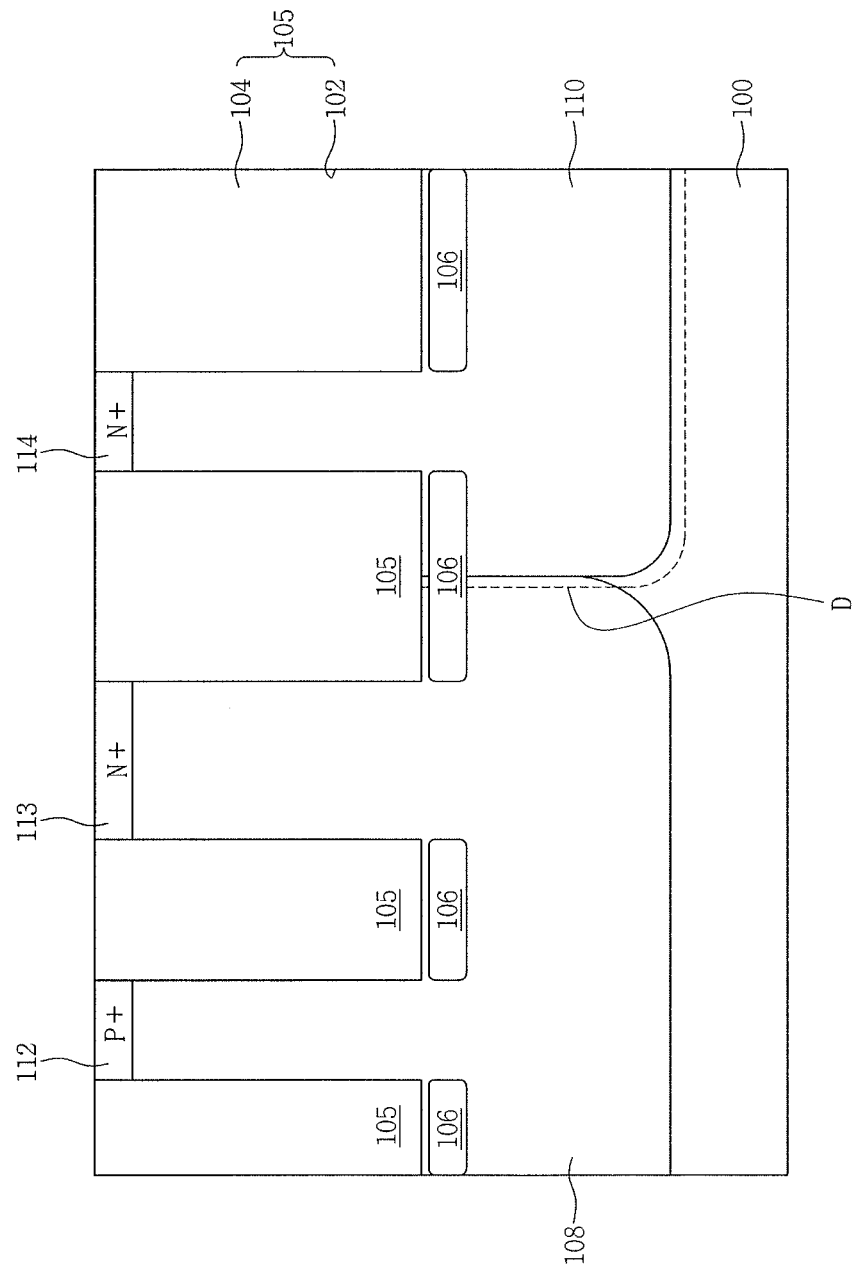
FIGS. 1 to 13 illustrate cross-sectional views of semiconductor devices in accordance with various embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments is not intended to limit the scope. The articles "a," "an," and "the" are singular in that they have a single referent, however the use of the singular form in the present document should not preclude the presence of more than one referent. In other words, elements of the embodiments referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein are to be interpreted as is customary in the art to which this application belongs. It will be further understood that terms in common usage should also be interpreted as is customary in the relevant art and not in an idealized or overly formal sense unless expressly so defined herein.

FIGS. 1 to 13 illustrate cross-sectional views of semiconductor devices in accordance with various embodiments.

First, a semiconductor device in accordance with an embodiment will be described with reference to FIG. 1.

Referring to FIG. 1, a semiconductor device in accordance with an embodiment may include a substrate 100, and a trench isolation region 105 and well regions 108 and 110 formed in the substrate 100.

The substrate 100 may be a semiconductor substrate, e.g., silicon, germanium, or silicon-germanium. In an implementation, the substrate 100 may be a p-type substrate.

The trench isolation region 105 may be formed in the substrate 100 to define active regions. The trench isolation region 105 may include a field trench 102 formed in the substrate 100, and an insulating layer 104 filling the field trench 102. The insulating layer 104 may include silicon oxide.

The trench isolation region 105 may be formed between various devices, e.g., between two NMOS transistors, between two PMOS transistors, between an NMOS transistor and a PMOS transistor, or the like. The trench isolation region 105 may function to isolate the devices from each other.

The well regions 108 and 110 may include an N-well 108 defining a PMOS transistor region, and a P-well 110 defining an NMOS transistor region.

A P+ active region 112 and an N-well guard-ring region 113 may be formed in a surface of the N-well 108. The P+ active region 112 may be provided as source/drain regions of the PMOS transistor. An N+ active region 114 may be formed in a surface of the P-well 110. Although not shown, a P-well guard-ring region may be formed in a surface of the P-well 110. The N+ active region 114 may be provided as source/drain regions of the NMOS transistor. The N-well guard-ring region 113 and the P-well guard-ring region may be formed to prevent latch-up phenomenon parasitically occurring between the N-well 108 and the P-well 110. The N-well guard-ring region 113 and the P-well guard-ring region may be formed in the form of a ring around the N-well 108 and the P-well 110.

A diffusion barrier region 106 containing carbon (C) may be formed under the trench isolation region 105. In an implementation, the diffusion barrier region 106 may further include germanium (Ge).

When a size of a semiconductor device decreases, a width of a device isolation region may also decrease, thereby increasing leakage current between the N-well 108 and the P-well 110, and degrading device isolation characteristics. The leakage current between the N-well 108 and the P-well 110 may include an N-well/P-well junction leakage current, a leakage current between the well guard-ring region and the transistor active region, and a leakage current flowing between the NMOS transistor and the PMOS transistor, etc.

When the depth of the trench isolation region 105 increases, in order to decrease the leakage current between the N-well 108 and the P-well 110, the width of the active region may decrease. In addition, the width as well as the depth of the trench isolation region 105 may be increased in order to enhance device isolation characteristics. Thus, the area of a chip may increase. Further, when increasing a well doping concentration in order to decrease the leakage current between the N-well 108 and the P-well 110, electrical characteristics of a transistor may change.

According to an embodiment, in order to enhance device isolation characteristics, the diffusion barrier region 106 containing carbon may be formed under the trench isolation region 105.

The carbon in the diffusion barrier region 106 may help prevent or suppress diffusion of N-type impurities doped in the N-well 108, e.g., phosphorous (P), or P-type impurities doped in the P-well 110, e.g., boron (B), in a boundary region between the N-well 108 and the P-well 110. Accordingly, counter-doping of the N-well 108 or the P-well 110 may be reduced and/or prevented by the diffusion barrier region 106 containing carbon, and the width of a depletion region (reference numeral D in FIG. 1) between the N-well 108 and the P-well 110 may be decreased by forming the P-well 110/N-well 108 junction to be an abrupt junction.

Accordingly, the distance between a depletion region of the P+ 112/N-well 108 and a depletion region of the P-well 110/N-well 108, and the distance between a depletion region of the N+ 114/P-well 110 and a depletion region of the P-well 110/N-well 108 may increase, thereby advantageously decreasing the leakage current between the N-well 108 and the P-well 110 and enhancing device isolation characteristics.

In addition, the diffusion barrier region 106 containing carbon may be formed under the trench isolation region 105 to increase resistances Rs of the N-well 108 and P-well 110. Accordingly, an effect of increasing the depth of the trench isolation region 105 may be implemented by the diffusion barrier region 106 containing carbon, and device isolation characteristics may be enhanced without a decrease of the width of the active region or a change in transistor characteristics.

Hereinafter, semiconductor devices in accordance with various embodiments will be described mainly on the modified parts from the above described embodiment, with duplicate or repeated explanations being omitted.

Figure 2:
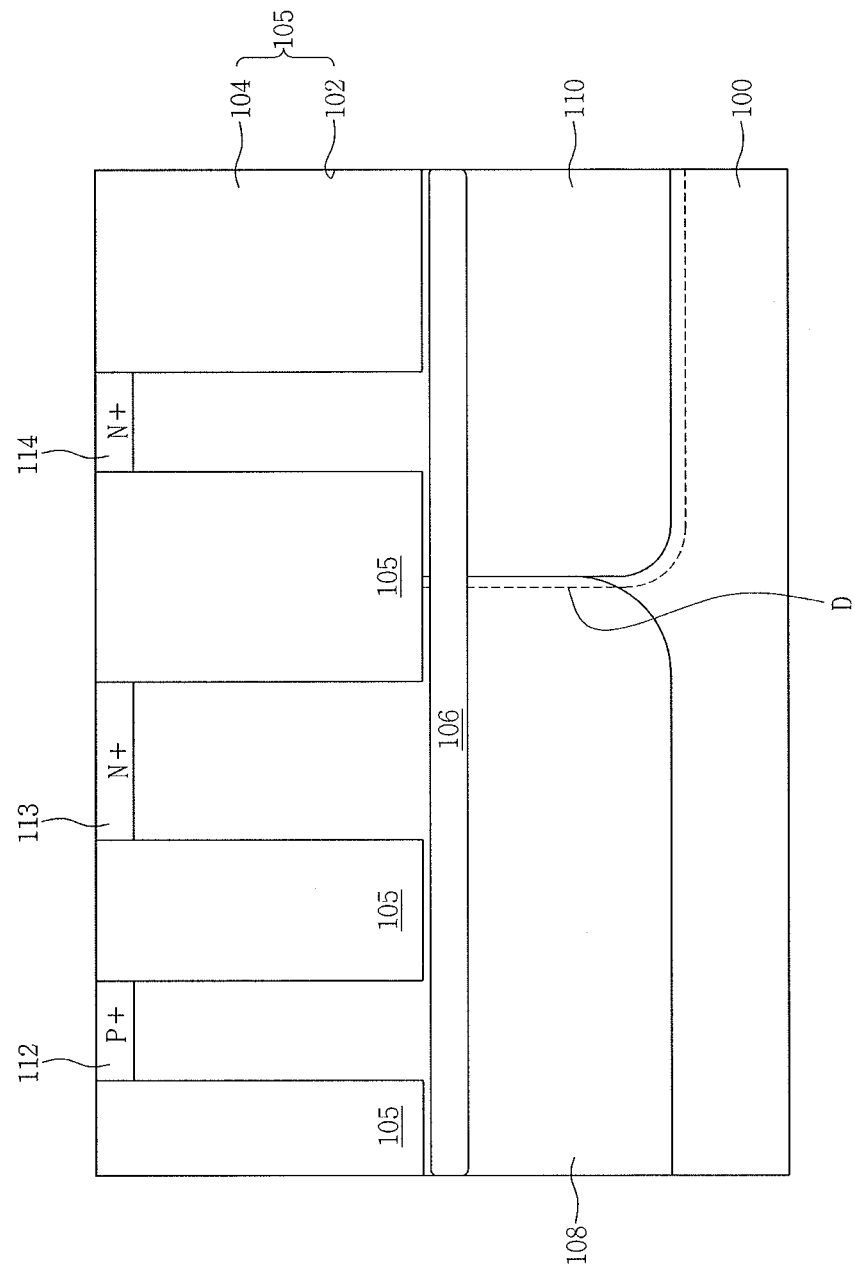

Referring to FIG. 2, a semiconductor device in accordance with an embodiment may include a substrate 100, a trench isolation region 105 formed in the substrate 100, an N-well 108 defining a PMOS transistor region, a P-well 110 defining an NMOS transistor region, and a diffusion barrier region 106 containing carbon.

The diffusion barrier region 106 containing carbon may be formed to extend over an entire surface of the substrate 100 under the trench isolation region 105.

The diffusion barrier region 106 may be formed of carbon, e.g., a non-conductive impurity. Thus, the diffusion barrier region 106 may not affect transistor characteristics even when formed to extend over the entire surface of the substrate 100.

Figure 3:
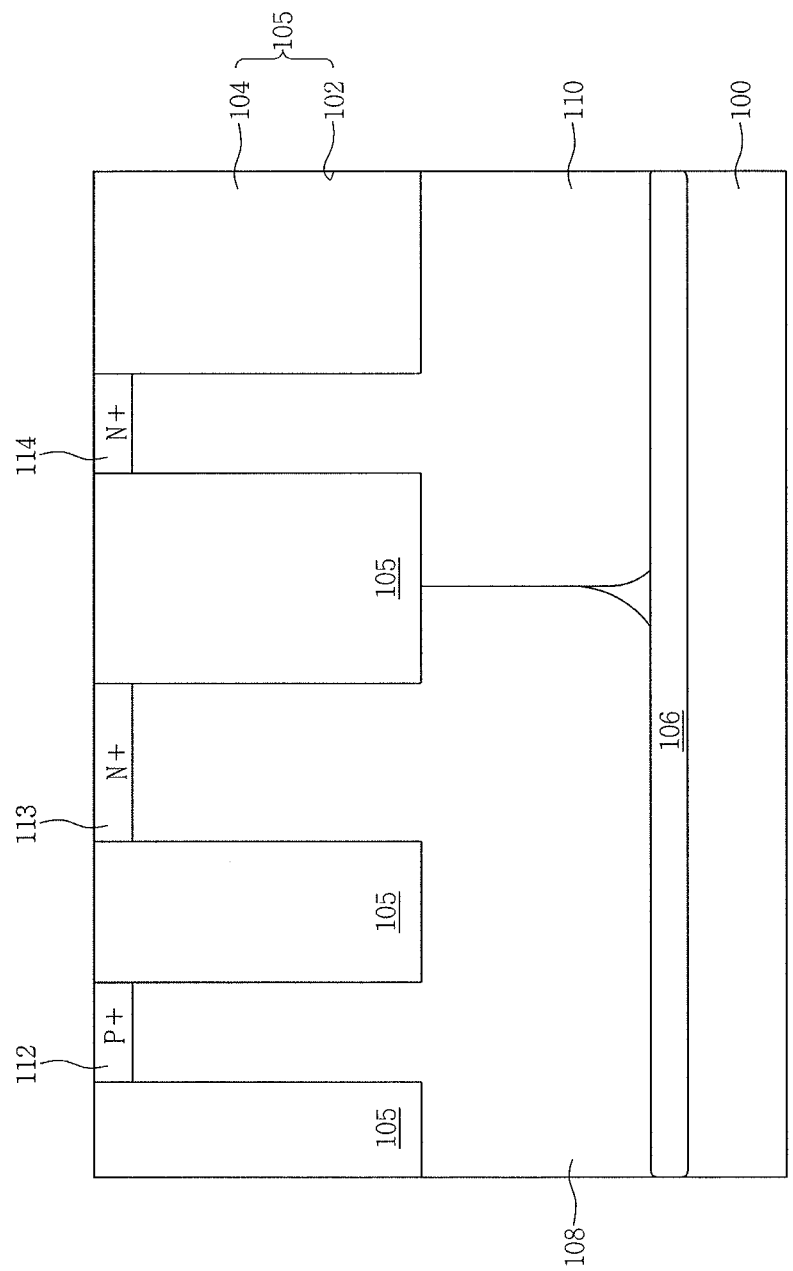

Referring to FIG. 3, a semiconductor device in accordance with an embodiment may include a substrate 100, a trench isolation region 105 formed in the substrate 100, an N-well 108 defining a PMOS transistor region, a P-well 110 defining an NMOS transistor region, and a diffusion barrier region 106 formed under the N-well 108 and the P-well 110.

In an implementation, the diffusion barrier region 106 may include carbon or carbon/germanium.

The carbon in the diffusion barrier region 106 may help prevent N-type impurities doped in the N-well 108 or P-type impurities doped in the P-well 110 from diffusing in a lateral or vertical direction. Accordingly, a latch-up phenomenon (in which a large current flows from a well to another well due to a parasitic lateral bipolar (npn) structure and a parasitic vertical bipolar (pnp) structure, which are formed by a twin well structure of the N-well 108 and P-well 110) may be prevented.

Figure 4:
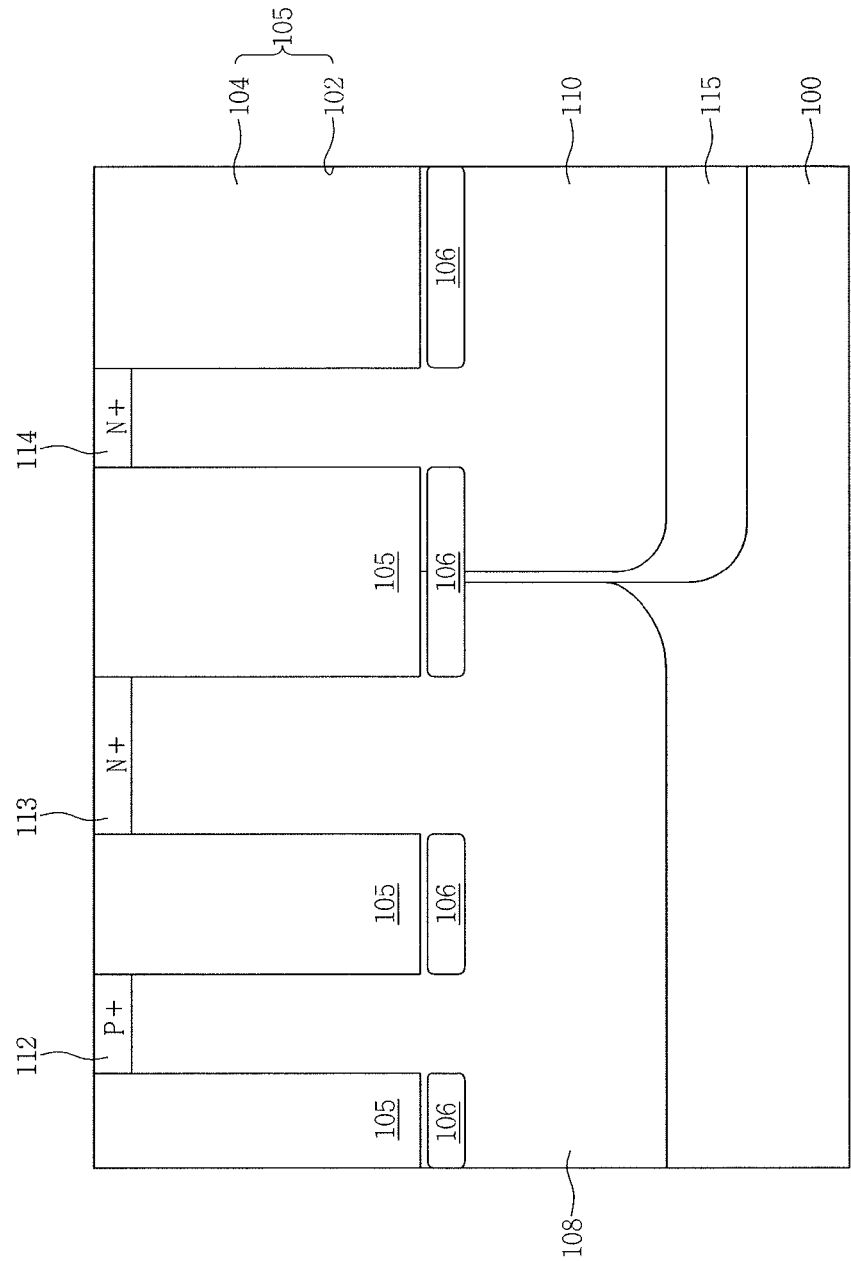

Referring to FIG. 4, a semiconductor device in accordance with an embodiment may include a substrate 100, a trench isolation region 105 formed in the substrate 100, a first N-well 108 defining a PMOS transistor region, a P-well 110 defining an NMOS transistor region, and a second N-well 115 deeply formed to surround the P-well 110.

A diffusion barrier region 106 containing carbon may be formed under the trench isolation region 105.

The diffusion barrier region 106 containing carbon may be applied to a suitable type of well structure, e.g., a twin-well, a triple-well, etc.

Figure 5:
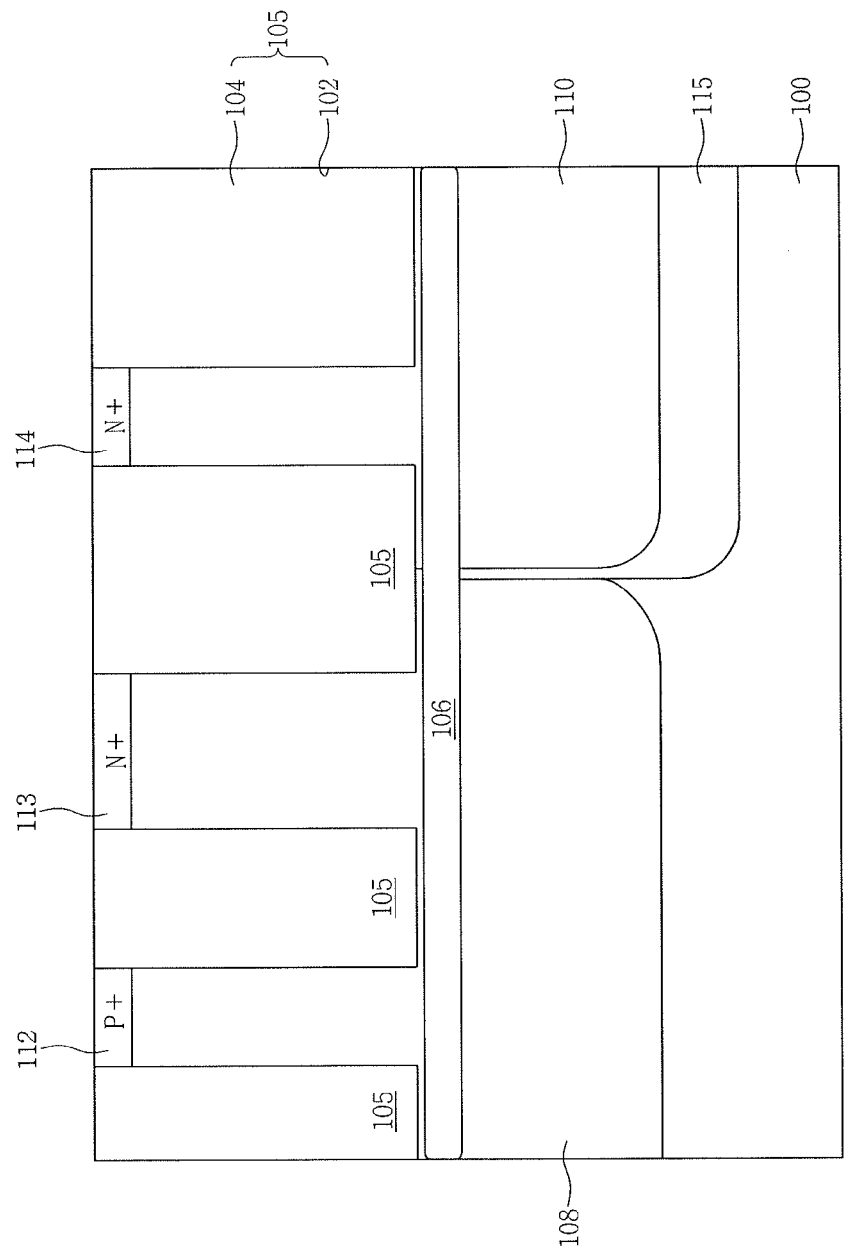

Referring to FIG. 5, a semiconductor device in accordance with an embodiment may include a substrate 100, a trench isolation region 105 formed in the substrate 100, a first N-well 108 defining a PMOS transistor region, a P-well 110 defining an NMOS transistor region, a second N-well 115 deeply formed to surround the P-well 110, and a diffusion barrier region 106 containing carbon and extending over the entire surface of the substrate 100 under the trench isolation region 105.

Figure 6:
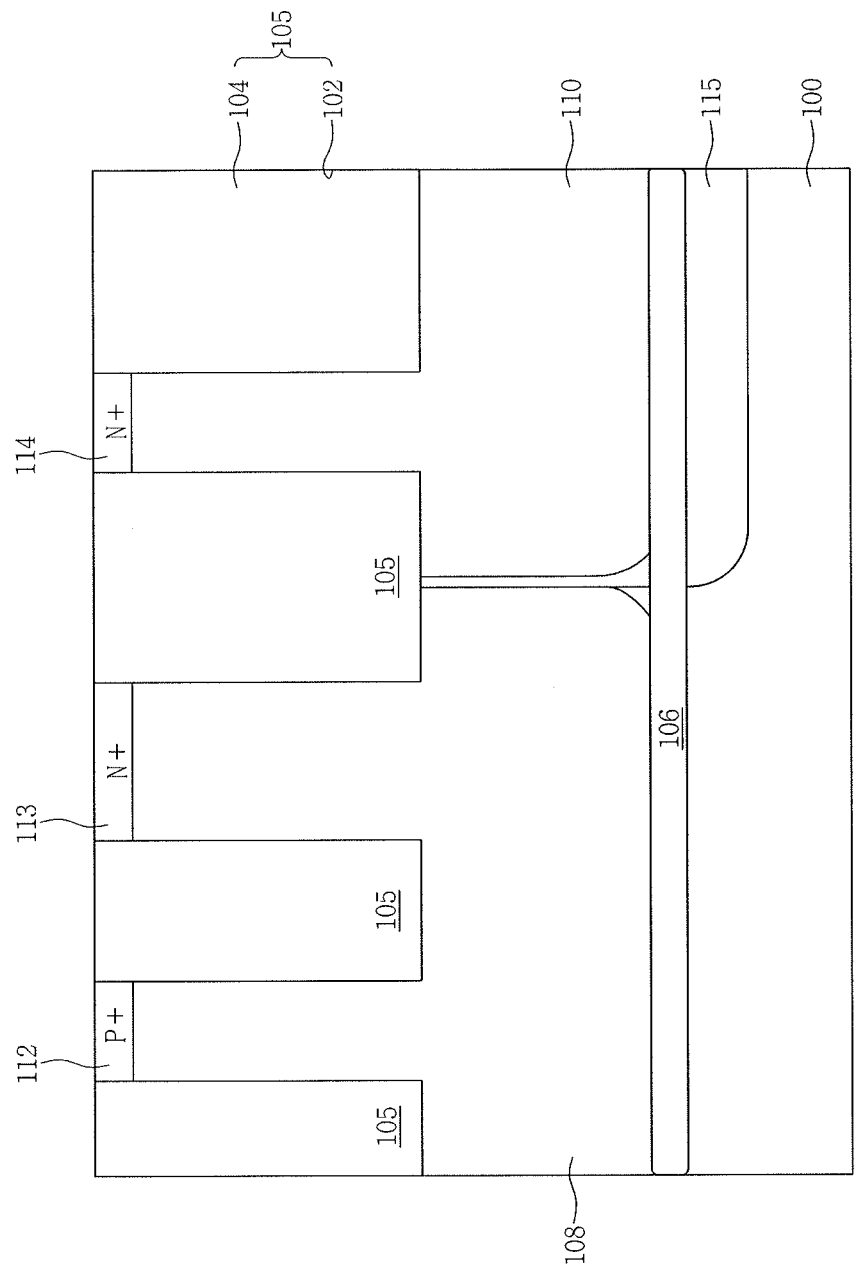

Referring to FIG. 6, a semiconductor device in accordance with an embodiment may include a substrate 100, a trench isolation region 105 formed in the substrate 100, a first N-well 108 defining a PMOS transistor region, a P-well 110 defining an NMOS transistor region, a second N-well 115 deeply formed to surround the P-well 110, and a diffusion barrier region 106 containing carbon and formed under the first N-well 108 and the P-well 110.

Figure 7:
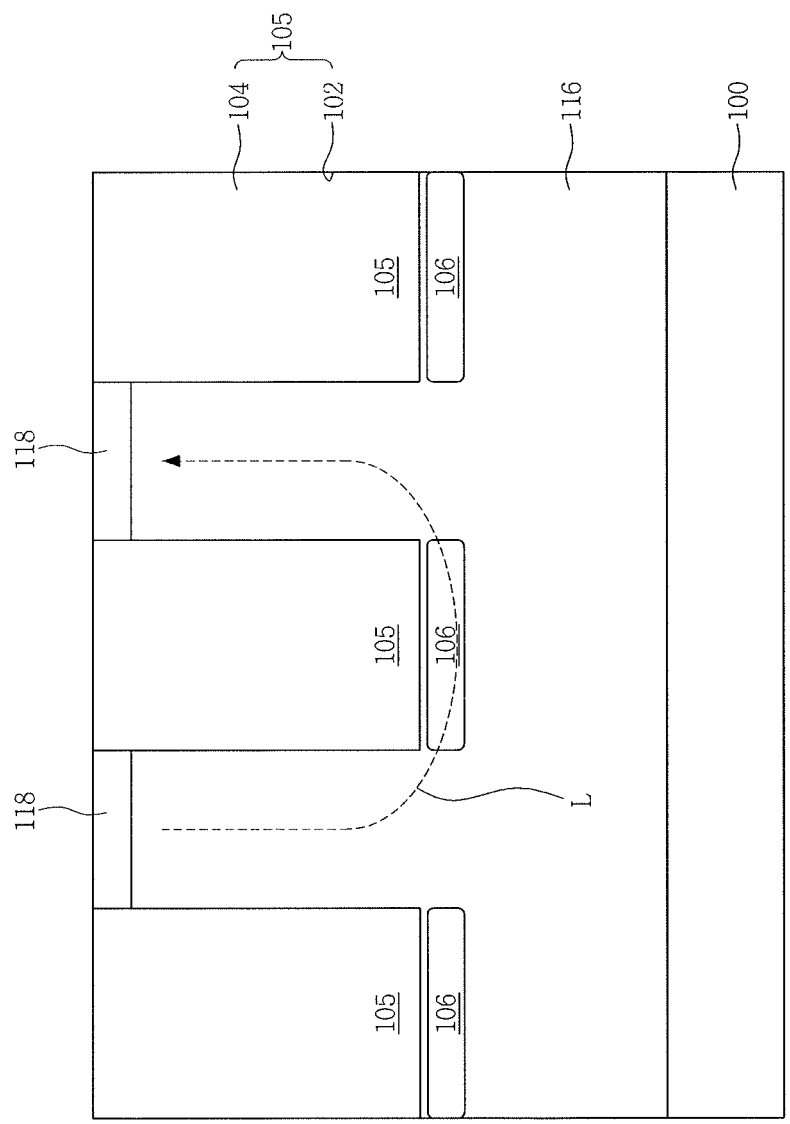

Referring to FIG. 7, a semiconductor device in accordance with an embodiment may include a substrate 100, a trench isolation region 105 formed in the substrate 100, and a P-type or an N-type doped well region 116 formed in the substrate 100.

The trench isolation region 105 may include a field trench 102 formed in the substrate 100, and an insulating layer 104 filling the field trench 102.

Active regions 118 of an NMOS transistor or a PMOS transistor may be formed in a surface of the well region 116.

A diffusion barrier region 106 containing carbon may be formed under the trench isolation region 105.

When the size of a semiconductor device decreases, the width of a device isolation region may also decrease. Thus, a leakage current between neighboring active regions 118 in a well region 116 may increase, and device isolation characteristics may be degraded.

As noted above, the diffusion barrier region 106 may be formed of or may include carbon, e.g., a non-conductive impurity. Thus, the resistance Rs of the well region 116 may increase, and an effect of increasing the depth of the trench isolation region 105 may be implemented. Accordingly, device isolation characteristics between neighboring active regions 118 in the same well may be enhanced.

Figure 8:
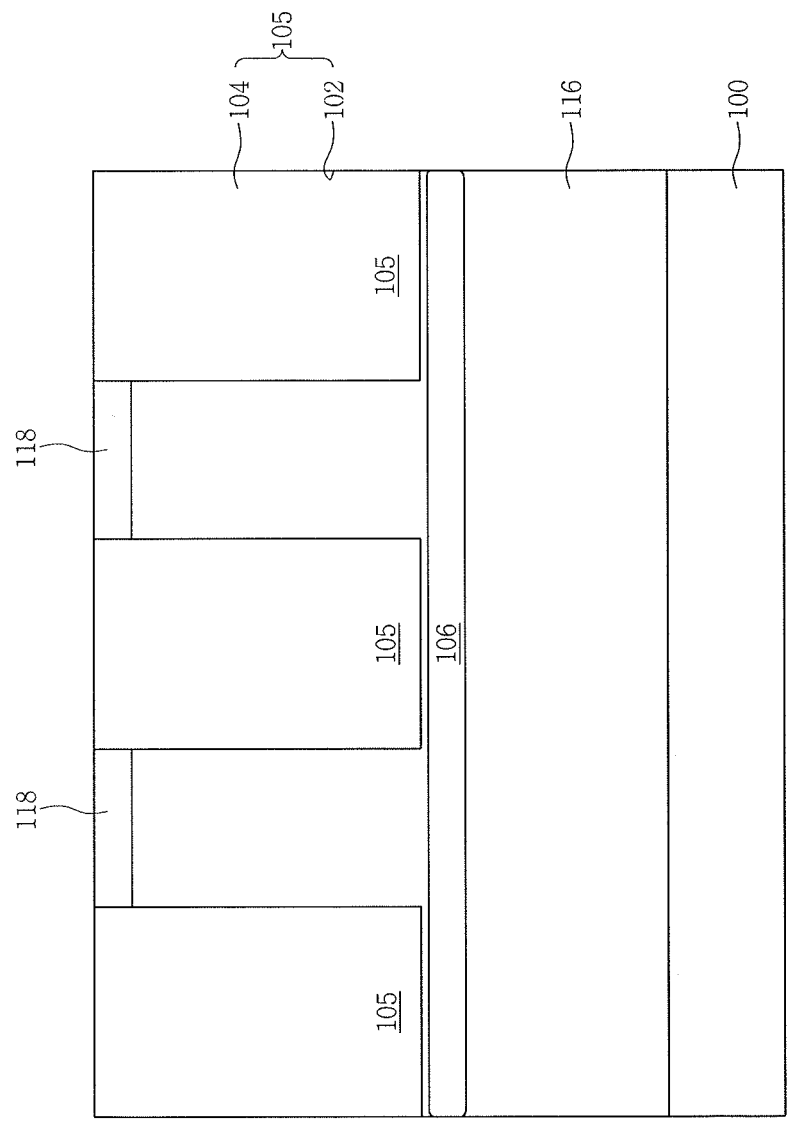

Referring to FIG. 8, a semiconductor device in accordance with an embodiment of the inventive concept may include a substrate 100, a trench isolation region 105 formed in the substrate 100, a P-type or an N-type doped well region 116 formed in the substrate 100, and a diffusion barrier region 106 containing carbon and formed to extend over the entire surface of the substrate 100 under the trench isolation region 105.

Figure 9:
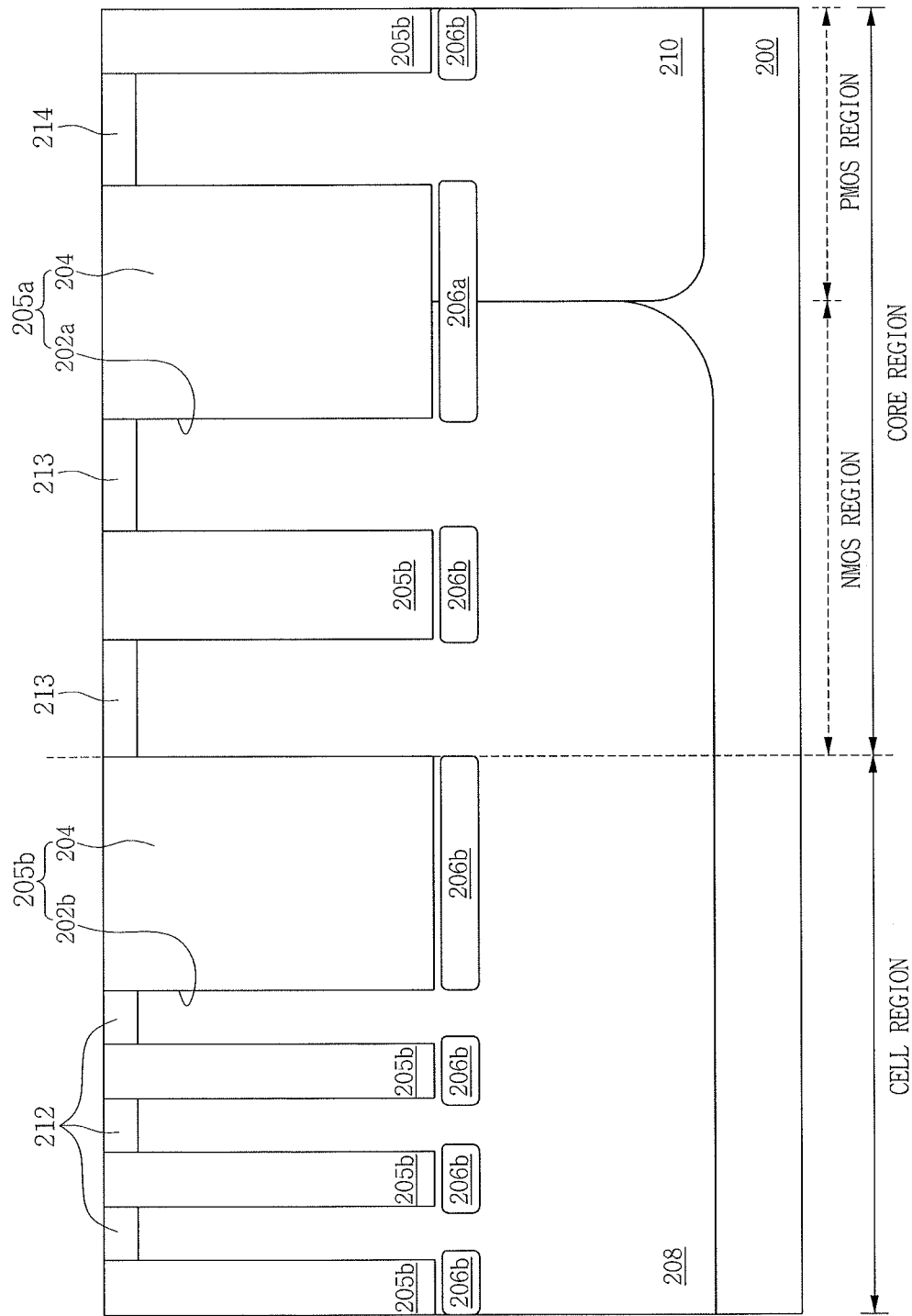

Referring to FIG. 9, a semiconductor device in accordance with an embodiment may include a substrate 200 having a cell region and a core region.

The substrate 200 may be a semiconductor substrate, e.g., silicon, germanium, or silicon-germanium. In an implementation, the substrate 200 may be a P-type substrate.

The cell region of the substrate 200 may include a plurality of memory cells connected between word lines and bit lines. The cell region may have a plurality of memory cell transistors having the same conductivity type and arranged at a uniform pitch. The memory cell transistors may include NMOS transistors.

The core region of the substrate 200 may include a circuit part controlling the memory cells together with a peripheral circuit region, and may have both an NMOS region and PMOS region formed therein.

A first trench isolation region 205a may be formed in the substrate 200 corresponding to between the NMOS region and the PMOS region of the core region, that is, between an NMOS transistor and a PMOS transistor. The first trench isolation region 205a may include a first field trench 202a, and an insulating layer 204 filling the first field trench 202a.

Second trench isolation regions 205b may be formed in the substrate 200 corresponding to the cell region and the NMOS and PMOS regions of the core region, e.g., between two NMOS transistors and between two PMOS transistors. The second trench isolation regions 205b may include a second field trench 202b, and the insulating layer 204 filling the second field trench 202b.

A P-well 208 may be formed in the substrate 200 corresponding to the cell region and the NMOS region of the core region, and an N-well 210 may be formed in the substrate 200 corresponding to the PMOS region of the core region.

N+ active regions 212 (of the NMOS transistor provided as a memory cell transistor) may be formed in a surface of the substrate 200 of the cell region. N+ active regions 213 of the NMOS transistor and a P+ active region 214 of the PMOS transistor may be formed in a surface of the substrate 200 of the core region.

First and second diffusion barrier regions 206a and 206b containing carbon may be formed under the first and second trench isolation regions 205a and 205b. The first and second diffusion barrier regions 206a and 206b may further include germanium.

The first diffusion barrier region 206a (formed under the first trench isolation region 205a) may help reduce the width of a depletion region between the P-well 208 and the N-well 210. Accordingly, a leakage current between the P-well 208 and the N-well 210 may decrease, and an effect of increasing the depth of the first trench isolation region 205a may be implemented, thereby enhancing well isolation characteristics.

The second diffusion barrier region 206b may be formed under the second trench isolation region 205b to help decrease a leakage current generated between neighboring transistors having the same conductivity type in the same well region, i.e., in the P-well 208 or N-well 210, and to help increase the depth of the second trench isolation region 205b, thereby enhancing active isolation characteristics.

Figure 10:
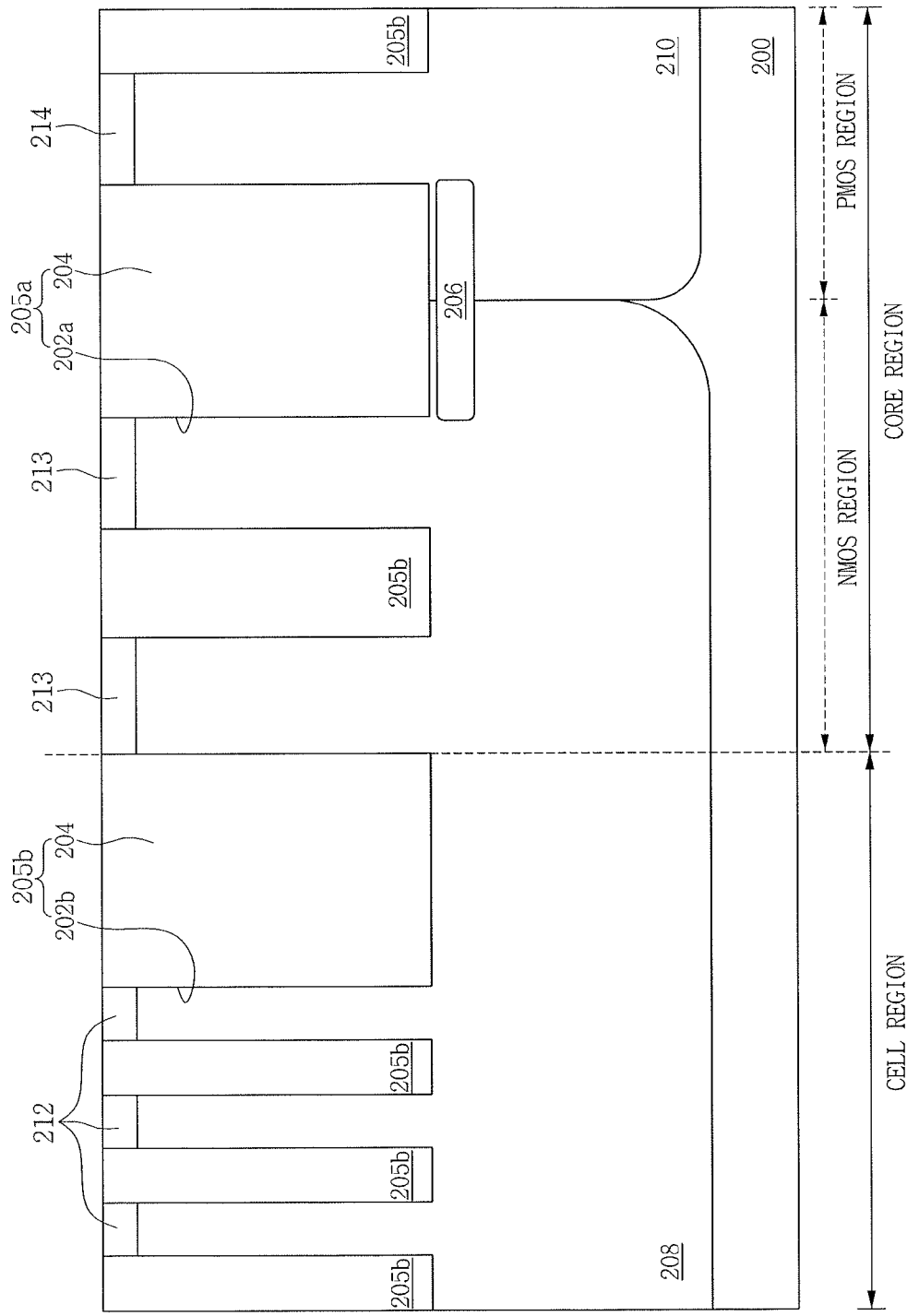

Referring to FIG. 10, a semiconductor device in accordance with an embodiment may include a substrate 200 having a cell region and a core region, a first trench isolation region 205a formed in the substrate 200 between an NMOS region and a PMOS region of the core region, second trench isolation regions 205b formed in the substrate 200 of the cell region and the NMOS and PMOS regions of the core region, a P-well 208 defining the cell region and the NMOS region of the core region, an N-well 210 defining the PMOS region of the core region, and a diffusion barrier region 206 formed under the first trench isolation region 205a and containing carbon.

When a semiconductor device has poor well isolation characteristics compared to the active isolation characteristics, the diffusion barrier region 206 containing carbon may be formed only under the first trench isolation region 205a between the NMOS region and the PMOS region.

Figure 11:
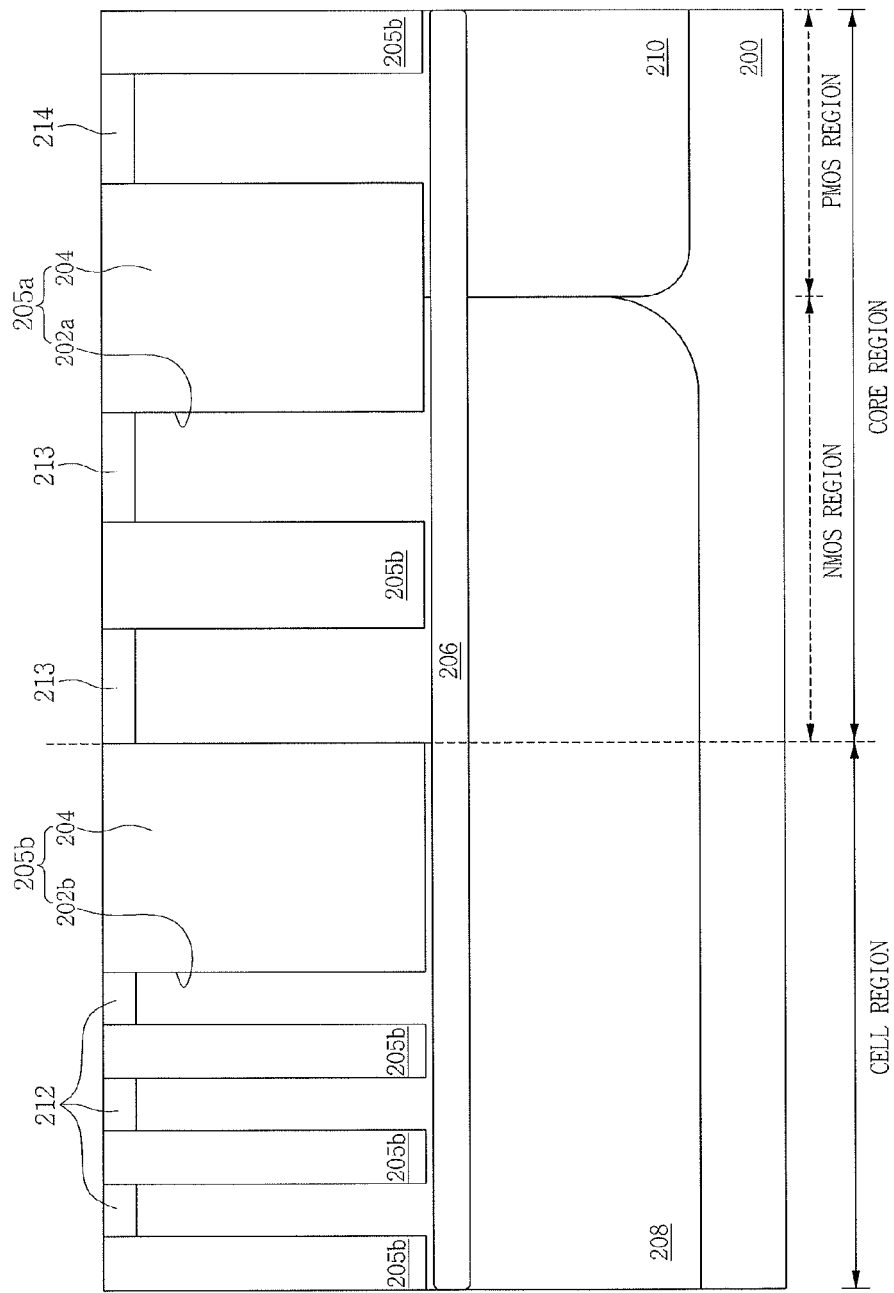

Referring to FIG. 11, a semiconductor device in accordance with an embodiment may include a substrate 200 having a cell region and a core region, a first trench isolation region 205a formed in the substrate 200 between an NMOS region and a PMOS region of the core region, second trench isolation regions 205b formed in the substrate 200 of the cell region and the NMOS and PMOS regions of the core region, a P-well 208 defining the cell region and the NMOS region of the core region, an N-well 210 defining the PMOS region of the core region, and a diffusion barrier region 206 containing carbon and extending over the entire surface of the substrate 100 under the first and second trench isolation regions 205a and 205b.

As noted above, the diffusion barrier region 206 may be formed of or may contain carbon, e.g., a non-conductive impurity. Thus, the diffusion barrier region 206 may not affect transistor characteristics even when formed to extend over the entire surface of the substrate 200.

Figure 12:
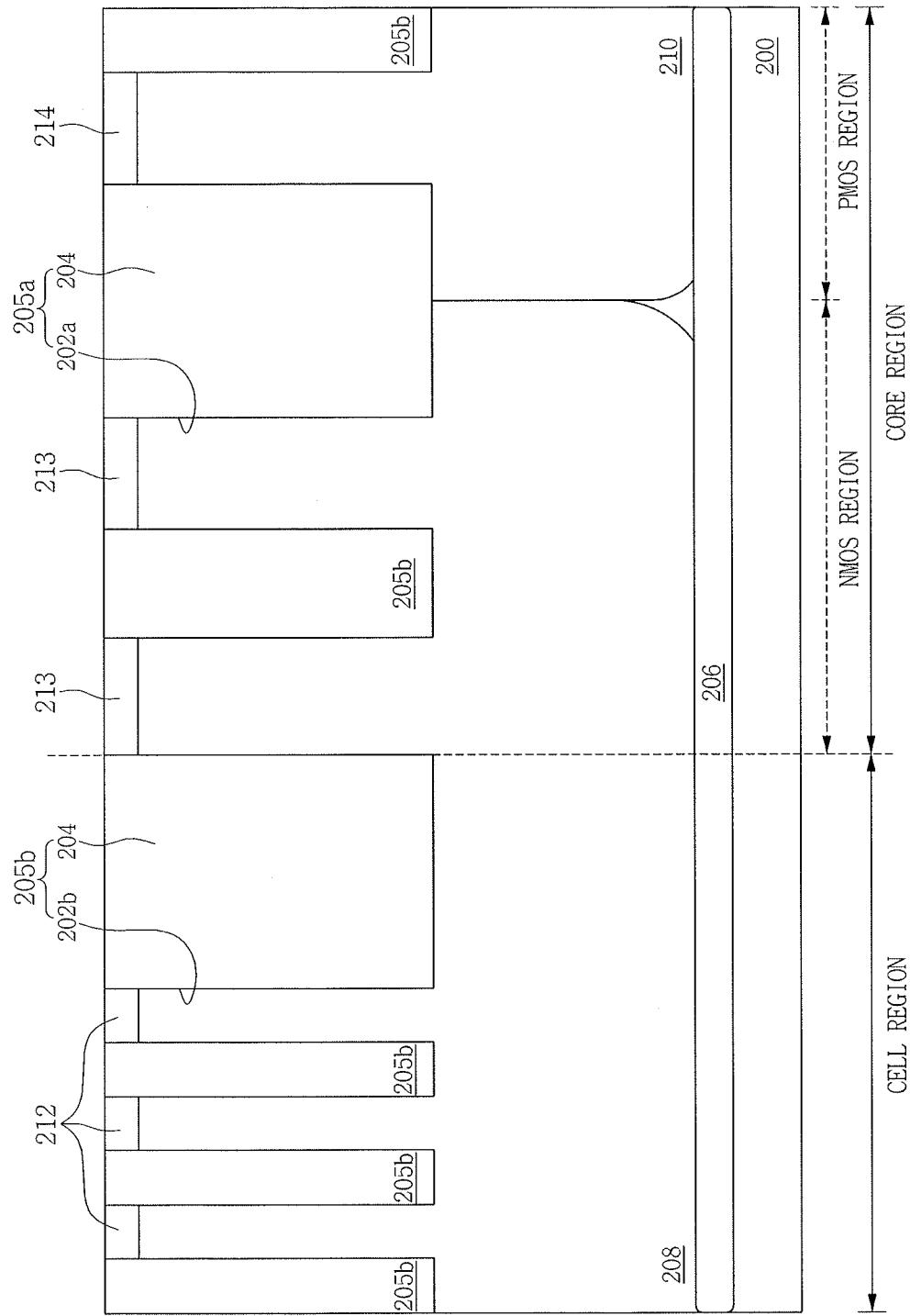

Referring to FIG. 12, a semiconductor device in accordance with an embodiment may include a substrate 200 having a cell region and a core region, a first trench isolation region 205a formed in the substrate 200 between an NMOS region and a PMOS region of the core region, second trench isolation regions 205b formed in the substrate 200 of the cell region and the NMOS and PMOS regions of the core region, a P-well 208 defining the cell region and the NMOS region of the core region, an N-well 210 defining the PMOS region of the core region, and a diffusion barrier region 206 containing carbon and formed under the P-well 208 and the N-well 210.

The carbon in the diffusion barrier region 206 may help prevent N-type impurities doped in the N-well 210 or P-type impurities doped in the P-well 208 from diffusing in a lateral or vertical direction. Accordingly, a latch-up phenomenon generated between the N-well 210 and the P-well 208 may be reduced and/or prevented.

Figure 13:
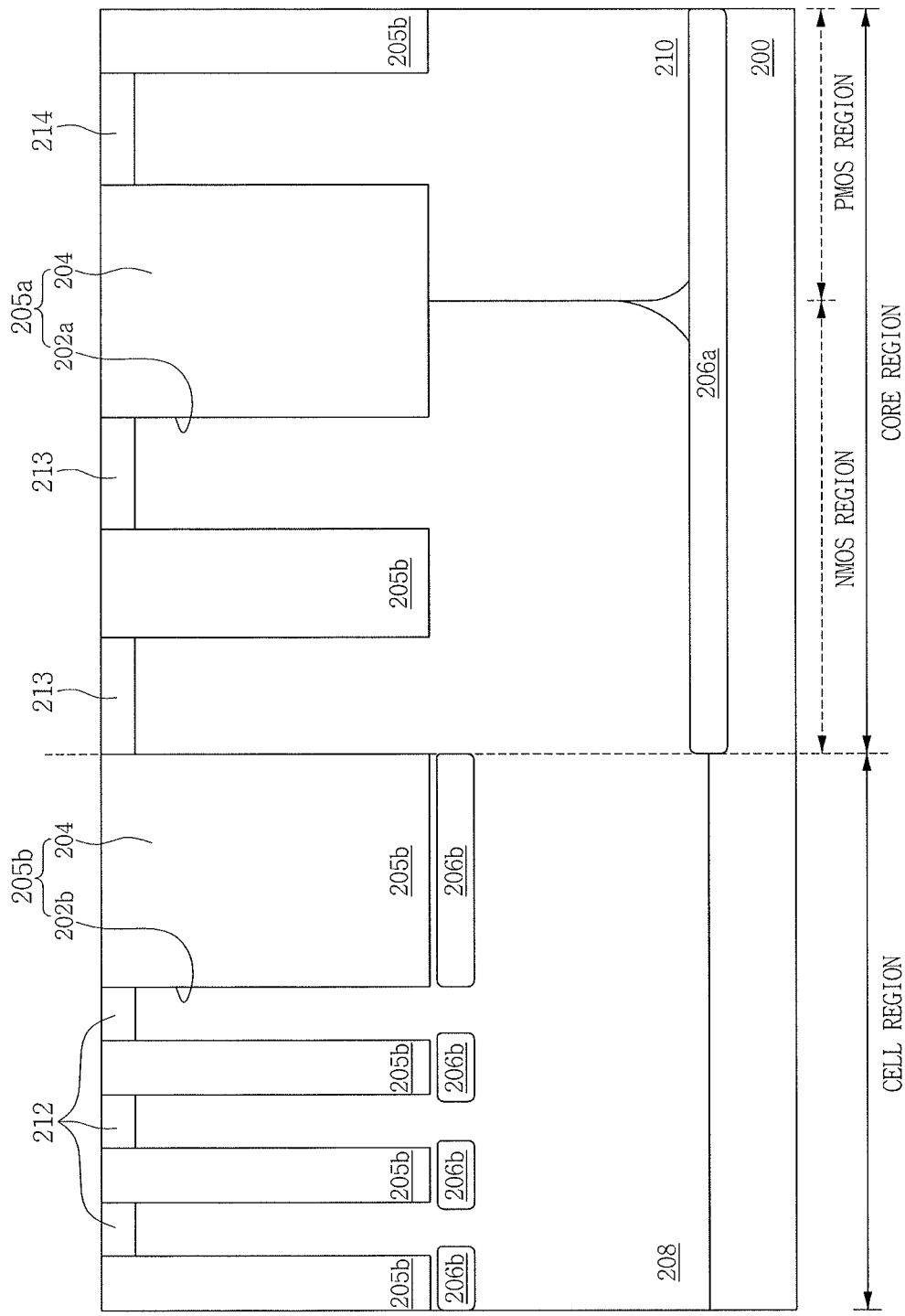

Referring to FIG. 13, a semiconductor device in accordance with an embodiment may include a substrate 200 having a cell region and a core region, a first trench isolation region 205a formed in the substrate 200 between an NMOS region and a PMOS region of the core region, second trench isolation regions 205b formed in the substrate 200 of the cell region and the NMOS and PMOS regions of the core region, a P-well 208 defining the cell region and the NMOS region of the core region, an N-well 210 defining the PMOS region of the core region, a first diffusion barrier region 206a formed under the P-well 208 and N-well 210 of the core region, and second diffusion barrier regions 206b formed under the second trench isolation regions 205b of the cell region.

The first and second diffusion barrier regions 206a and 206b may include carbon or carbon/germanium.

According to an embodiment, the first diffusion barrier region 206a may be formed under the wells 208 and 210 in the core region having both the NMOS region and PMOS region to prevent a latch-up phenomenon and enhance well isolation characteristics, and the second diffusion barrier regions 206b may be formed under the second trench isolation regions 205b in the cell region in which a plurality of memory cells are integrated in a limited area, to enhance active isolation characteristics.

Hereinafter, methods of manufacturing semiconductor devices in accordance with various embodiments will be described.

FIGS. 14A to 14D illustrate cross-sectional views of stages in a method of manufacturing a semiconductor device in accordance with an embodiment.

Referring to FIG. 14A, the method of manufacturing a semiconductor device in accordance with an embodiment may include forming a trench mask 101 on a substrate 100, and forming a field trench 102 in the substrate 100.

The substrate 100 may be a semiconductor substrate, e.g., silicon, germanium, or silicon-germanium. For example, the substrate 100 may be a P-type substrate.

The trench mask 101 may include a material that is patterned to form an etch mask, e.g., silicon oxide, silicon nitride, or a multilayered structure of silicon oxide and silicon nitride. The trench mask 101 may be patterned by a photolithography and etching process to define a trench isolation region.

The field trench 102 may be formed by etching an exposed substrate 100 using the trench mask 101 as an etch mask. Inner walls of the field trench 102 may be formed to have a tapered slope.

After the field trench 102 is formed, sidewalls of the field trench 102 may be oxidized to help reduce stress incurred by the etching process of the field trench 102, and to help remove surface contaminants.

Figure 14B:
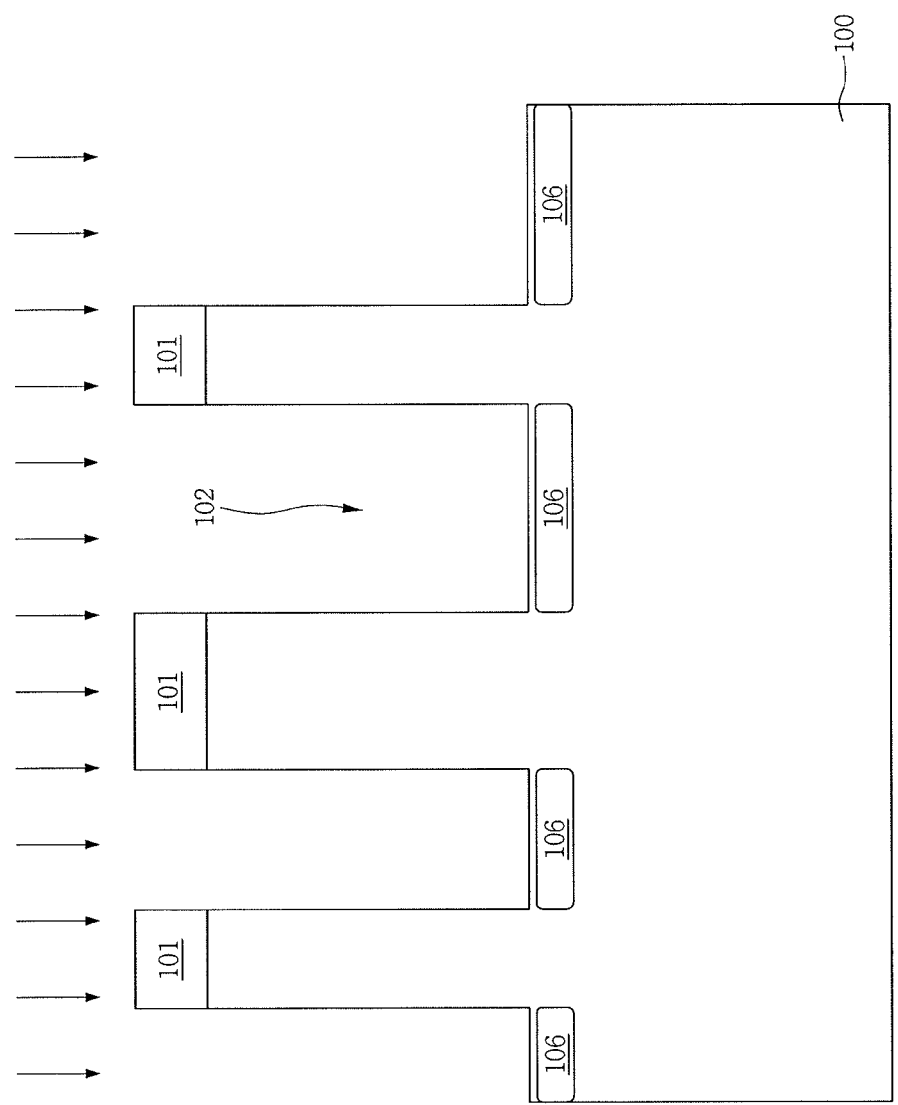

Referring to FIG. 14B, the method may include forming a diffusion barrier region 106 by implanting carbon under the field trench 102.

The carbon implantation may be performed without an additional mask. The trench mask 101 used in forming the field trench 102 may block the carbon from entering the other portions of the substrate 100. Accordingly, the carbon implantation may be self-aligned to the field trench 102, and may not use additional masks or additional process steps.

The carbon may help prevent diffusion of P-type impurities of a P-well defining an NMOS transistor region, or N-type impurities of an N-well defining a PMOS transistor region. Accordingly, the carbon may help reduce the width of a depletion region between the P-well and the N-well by preventing counter-doping of a P-well or N-well, and forming the P-well/N-well junction to be an abrupt junction.

The diffusion barrier region 106 may be formed by implanting carbon only, or by implanting carbon and germanium.

Figure 14C:
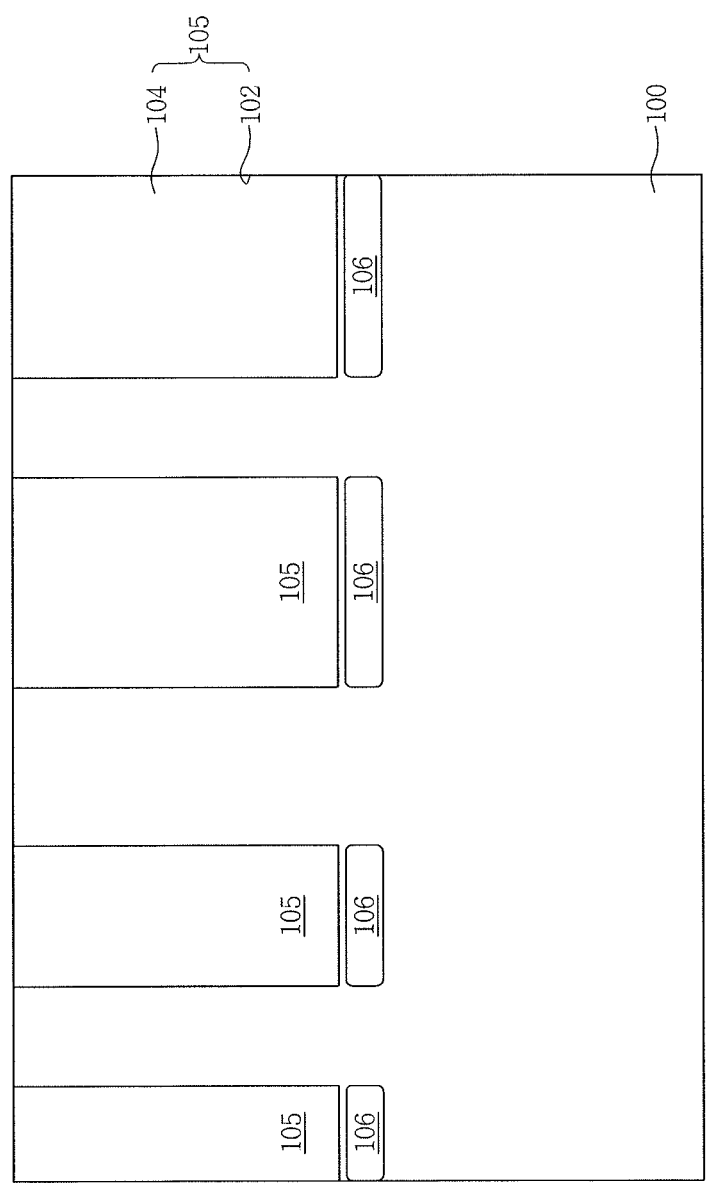

Referring to FIG. 14C, the method may include forming a trench isolation region 105 by filling the field trench 102 with an insulating layer 104 and planarizing the substrate 100.

The insulating layer 104 may include silicon oxide or an insulating material having excellent fluidity.

The planarization of the substrate 100 may be performed by a CMP or an etch-back process. The trench mask 101 may be removed by the planarization process. In an implementation, the trench mask 101 may be removed before filling the field trench 102 with the insulating layer 104.

The diffusion barrier region 106 (containing carbon) may help increase the resistance of a substrate region under the field trench 102, which implements an effect of increasing the depth of the trench isolation region 105.

Figure 14D:
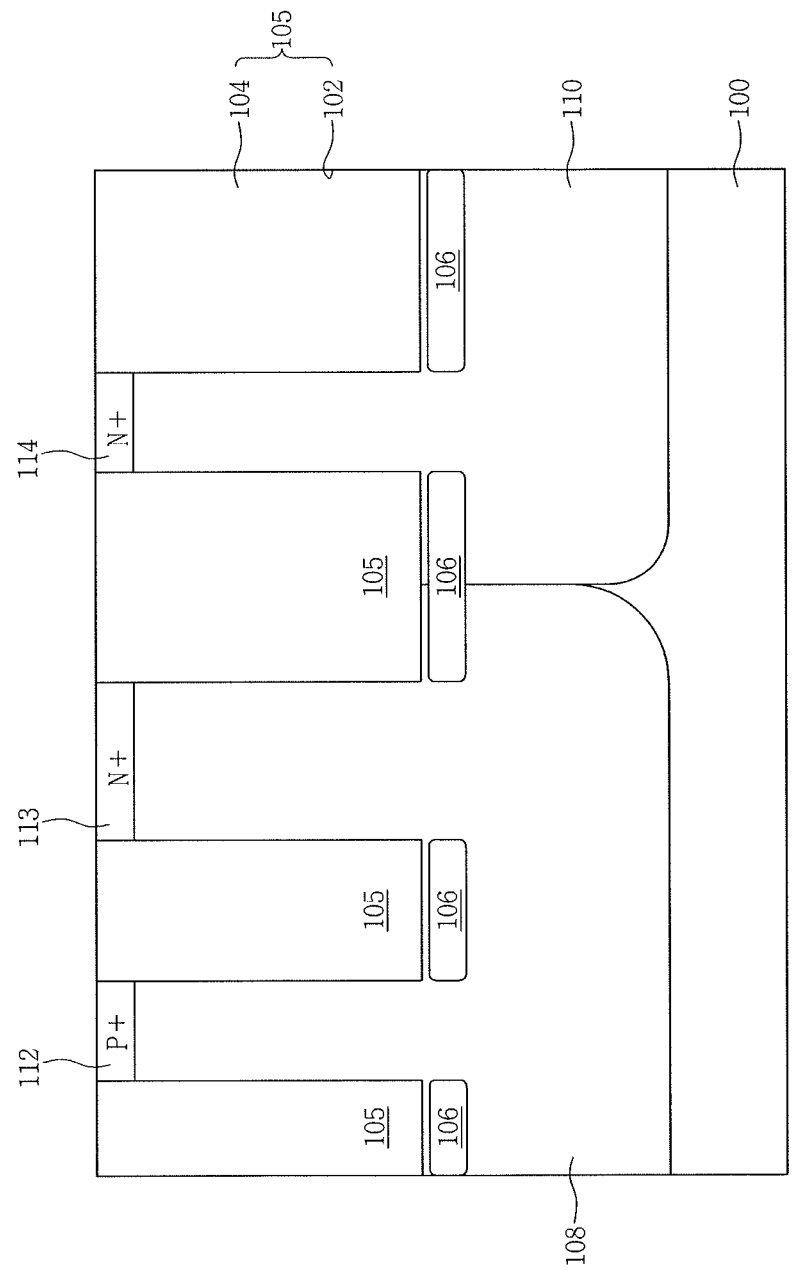

Referring to FIG. 14D, the method may include manufacturing individual devices at sides of the trench isolation region 105. For example, the method may include forming an N-well 108 and a P-well 110 in the substrate 100, forming a PMOS transistor having a P+ active region 112 in the N-well 108, and an NMOS transistor having an N+ active region 114 in the P-well 110.

In addition, the method may include forming an N+ guard-ring region 113 in the N-well 108, and a P+ guard-ring region in the P-well 110. The guard-ring region may be formed to prevent a latch-up phenomenon which parasitically occurs between the N-well 108 and the P-well 110, and formed in a ring shape around the well.

In the method of manufacturing a semiconductor device in accordance with an embodiment, after the diffusion barrier region 106 is formed by implanting carbon under the field trench 102, the trench isolation region 105 may be formed by filling the field trench 102, and then the N-well 108 and the P-well 110 may be formed in the substrate 100, which results in a decrease of a leakage current between the N-well 108 and the P-well 110 and the enhancement of the well isolation characteristics.

Figure 15A:
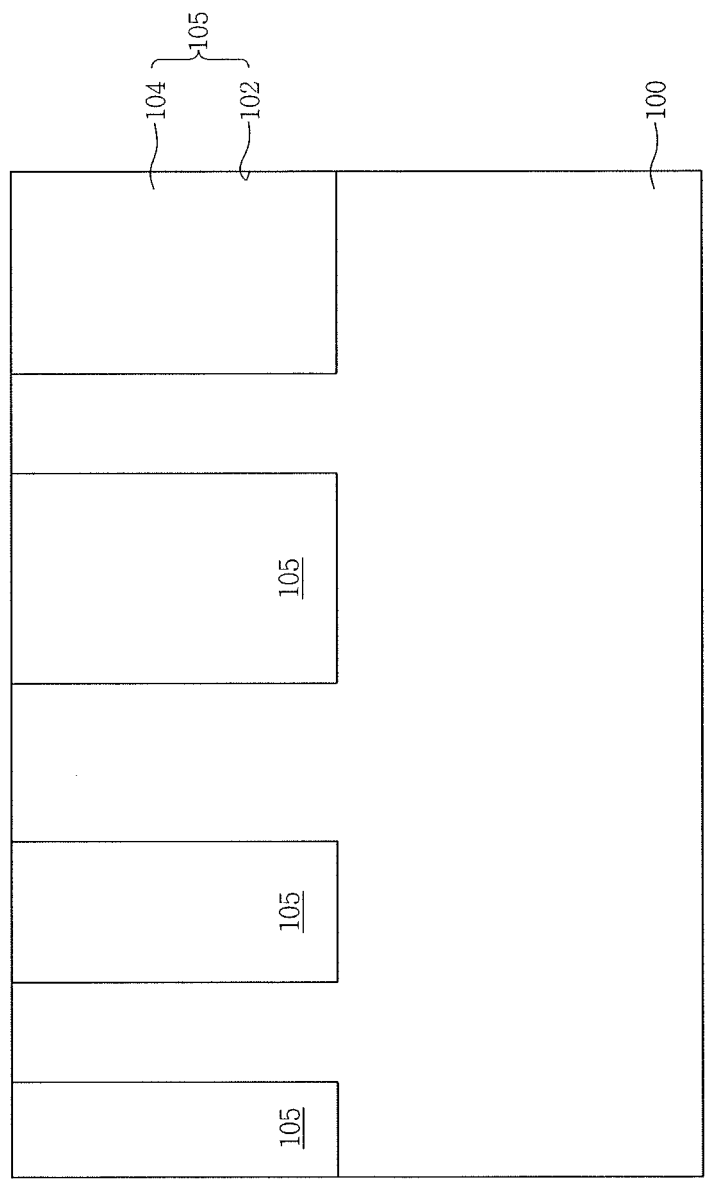
Figure 15C:
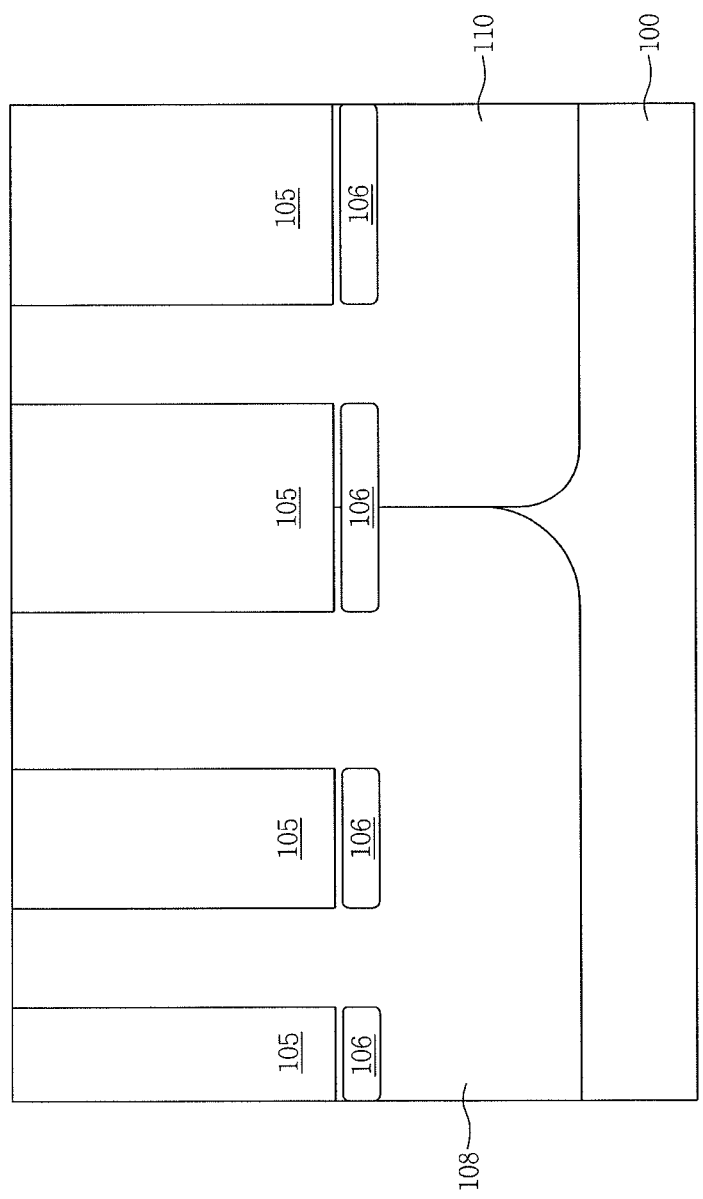

FIGS. 15A to 15C illustrate cross-sectional views of stages in a method of manufacturing a semiconductor device in accordance with an embodiment.

Referring to FIG. 15A, the method of manufacturing a semiconductor device in accordance with an embodiment may include forming a field trench 102 in a substrate 100 by performing the processes described with reference to FIG. 14A, and forming a trench isolation region 105 by filling the field trench 102 with an insulating layer 104 and planarizing the substrate 100.

Referring to FIG. 15B, the method may include forming a mask pattern 111 opening or exposing the trench isolation region 105 on the substrate 100, and forming a diffusion barrier region 106 by implanting carbon to under the trench isolation region 105 using the mask pattern 111 as an ion-implantation mask.

The mask pattern 111 may be formed of a material that blocks the carbon from entering the other portions of the substrate 100, e.g., photoresist, silicon nitride, or another inorganic material.

The diffusion barrier region 106 may be formed by implanting carbon only, or by implanting carbon and germanium.

Referring to FIG. 15C, the method may include removing the mask pattern 111, and forming an N-well 108 defining a PMOS transistor region, and a P-well 110 defining an NMOS transistor region in the substrate 100.

In the method of manufacturing a semiconductor device in accordance with an embodiment, after forming the trench isolation region 105 in the substrate 100, the diffusion barrier region 106 may be formed by implanting carbon under the trench isolation region 105, and then the N-well 108 and the P-well 110 may be formed in the substrate 100, which may result in the decrease of a leakage current between the N-well 108 and the P-well 110 and the enhancement of well isolation characteristics.

Figure 16B:
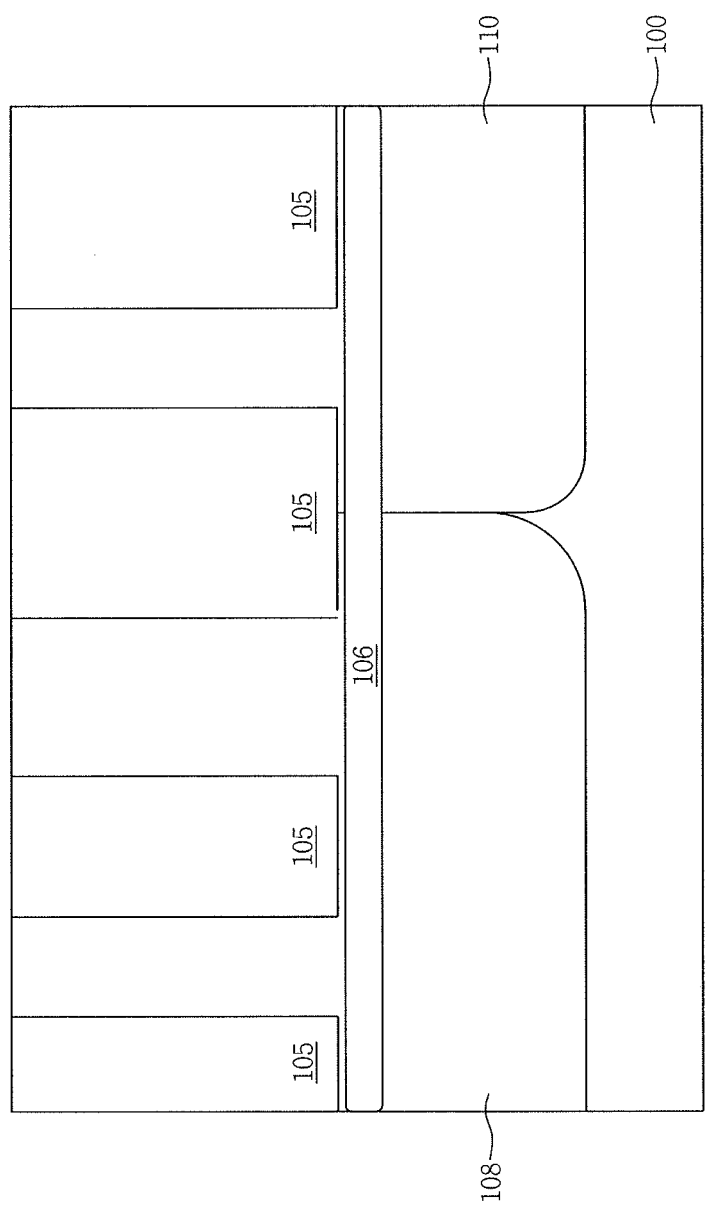

FIGS. 16A and 16B illustrate cross-sectional views of stages in a method of manufacturing a semiconductor device in accordance with an embodiment.

Referring to FIG. 16A, the method of manufacturing a semiconductor device in accordance with an embodiment may include forming a trench isolation region 105 including a field trench 102 and an insulating layer 104 filling the field trench 102 in a substrate 100 by performing the processes described with reference to FIG. 15A, and forming a diffusion barrier region 106 under the trench isolation region 105 by implanting carbon into the entire surface of the substrate 100.

The diffusion barrier region 106 may be formed by implanting carbon into the entire surface of the substrate 100 without any additional mask, in such a way that a projected range (Rp) of ion-implantation is located under the trench isolation region 105.

Referring to FIG. 16B, the method may include forming an N-well 108 (defining a PMOS transistor region), and a P-well 110 (defining an NMOS transistor region) in the substrate 100.

In the method of manufacturing a semiconductor device in accordance with an embodiment, after forming the trench isolation region 105 in the substrate 100, the diffusion barrier region 106 may be formed to extend over the entire surface of the substrate 100 under the trench isolation region 105, and then the N-well 108 and the P-well 110 may be formed in the substrate 100, which may result in the decrease of a leakage current between the N-well 108 and the P-well 110 and the enhancement of well isolation characteristics.

Figure 17A:
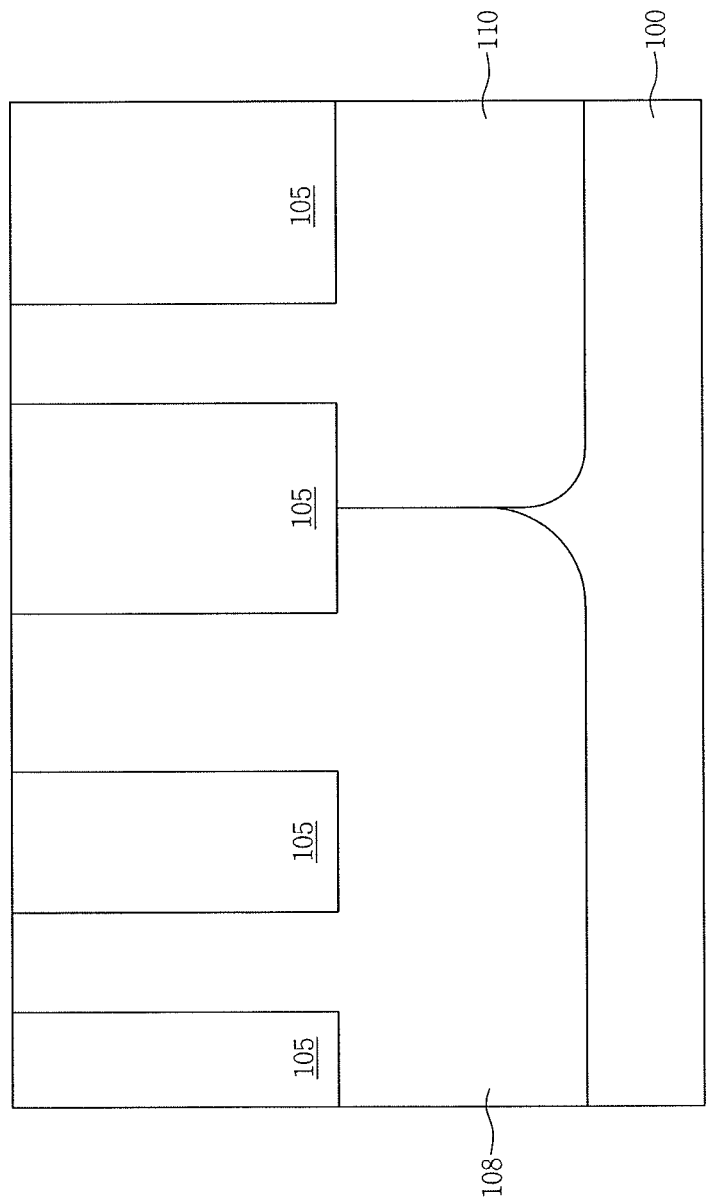

FIGS. 17A and 17B illustrate cross-sectional views of stages in a method of manufacturing a semiconductor device in accordance with an embodiment.

Referring to FIG. 17A, the method of manufacturing a semiconductor device in accordance with an embodiment may include forming a trench isolation region 105 including a field trench 102 and an insulating layer 104 filling the field trench 102 in a substrate 100 by performing the processes described with reference to FIG. 15A, and forming an N-well 108 defining a PMOS transistor region and a P-well 110 defining an NMOS transistor region in the substrate 100.

Referring to FIG. 17B, the method may include forming a mask pattern 111 opening or exposing the trench isolation region 105 on the substrate 100, and forming a diffusion barrier region 106 by implanting carbon under the trench isolation region 105 by using the mask pattern 111 as an ion-implantation mask.

The mask pattern 111 may be formed of a material that blocks the carbon from entering the other portions of the substrate 100, e.g., photoresist, silicon nitride, or another inorganic material.

In the method of manufacturing a semiconductor device in accordance with an embodiment, after forming the trench isolation region 105, the diffusion barrier region 106 may be formed under the trench isolation region 105 and then, the N-well 108 and the P-well 110 may be formed in the substrate 100, thereby decreasing a leakage current between the N-well 108 and the P-well 110 and enhancing well isolation characteristics.

FIG. 18 illustrates a cross-sectional view of a stage in a method of manufacturing a semiconductor device in accordance with an embodiment.

Referring to FIG. 18, the method of manufacturing a semiconductor device in accordance with an embodiment may include forming a trench isolation region 105 in a substrate 100 by performing the processes described with reference to FIG. 17A, forming an N-well 108 defining a PMOS transistor region and a P-well 110 defining an NMOS transistor region in the substrate 100, and forming a diffusion barrier region 106 under the trench isolation region 105 by implanting carbon into the entire surface of the substrate 100.

The diffusion barrier region 106 may be formed by implanting carbon into the entire surface of the substrate 100 without any additional mask, in such a way that a projected range (Rp) of ion-implantation is located under the trench isolation region 105.

In the method of manufacturing a semiconductor device in accordance with an embodiment, after forming the trench isolation region 105, the diffusion barrier region 106 may be formed to extend over the entire surface of the substrate 100 under the trench isolation region 105 and then, the N-well 108 and the P-well 110 may be formed in the substrate 100, thereby decreasing a leakage current between the N-well 108 and the P-well 110 and enhancing well isolation characteristics.

FIG. 19 illustrates a cross-sectional view of a stage in a method of manufacturing a semiconductor device in accordance with an embodiment.

Referring to FIG. 19, the method of manufacturing a semiconductor device in accordance with an embodiment may include forming a trench isolation region 105 in a substrate 100 by performing the processes described with reference to FIG. 17A, forming an N-well 108 defining a PMOS transistor region and a P-well 110 defining an NMOS transistor region in the substrate 100, and forming a diffusion barrier region 106 under the N-well 108 and the P-well 110 by implanting carbon into the entire surface of the substrate 100.

The diffusion barrier region 106 may be formed by implanting carbon into the entire surface of the substrate 100 without any additional mask, in such a way that a projected range (Rp) of ion-implantation is located under the N-well 108 and the P-well 110.

In the method of manufacturing a semiconductor device in accordance with an embodiment, after forming the trench isolation regions 105, the diffusion barrier region 106 may be formed under the N-well 108 and the P-well 110 and then, the N-well 108 and the P-well 110 may be formed in the substrate 100, thereby decreasing a leakage current between the N-well 108 and the P-well 110 and enhancing well isolation characteristics.

FIGS. 20A to 20D illustrate cross-sectional views of stages in a method of manufacturing a semiconductor device in accordance with an embodiment.

Figure 20A:
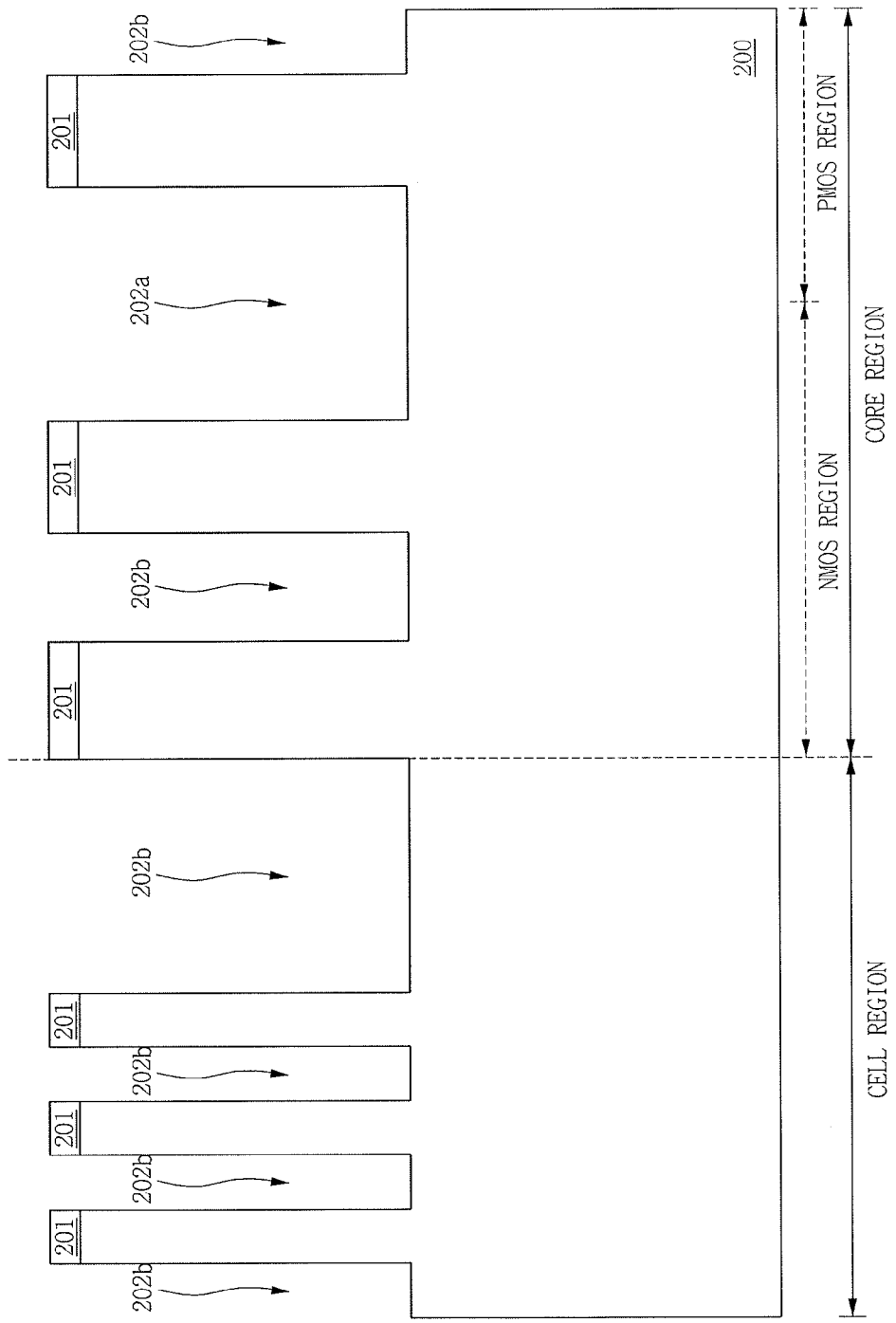

Referring to FIG. 20A, the method of manufacturing a semiconductor device in accordance with an embodiment may include forming a trench mask 201 on a substrate 200 including a cell region and a core region, and forming a first field trench 202a and second field trenches 202b in the substrate 200.

The substrate 200 may be a semiconductor substrate, e.g., silicon, germanium, or silicon-germanium. For example, the substrate 200 may be a P-type substrate.

The cell region of the substrate 200 may include a plurality of memory cells connected between word lines and bit lines. The cell region may have a plurality of memory cell transistors having the same conductivity type and arranged at a uniform pitch. The memory cell transistors may include or consist of NMOS transistors. The core region of the substrate 200 may include a circuit part for controlling the memory cells together with a peripheral circuit region, and may have both an NMOS region and PMOS region formed therein.

The trench mask 201 may include a material that is patterned to form an etch mask, e.g., silicon oxide, silicon nitride, or a multilayered structure of silicon oxide and silicon nitride. The trench mask 201 may be patterned by a photolithography and etching process to define trench isolation regions.

The first and second field trenches 202a and 202b may be formed by etching an exposed substrate 200 using the trench mask 201 as an etch mask. In an implementation, inner walls of the first and second field trenches 202a and 202b may be formed to have a tapered slope.

The first field trench 202a may be formed in the substrate 200 corresponding to between the NMOS region and the PMOS region of the core region. The second field trenches 202b may be formed in the substrate 200 corresponding to the cell region and the NMOS and PMOS regions of the core region, e.g., between two NMOS transistors and between two PMOS transistors.

After forming the first and second field trenches 202a and 202b, sidewalls of the first and second field trenches 202a and 202b may be oxidized to help reduce stress incurred by the process of etching the first and second field trenches 202a and 202b, and to help remove surface contaminants.

Figure 20B:
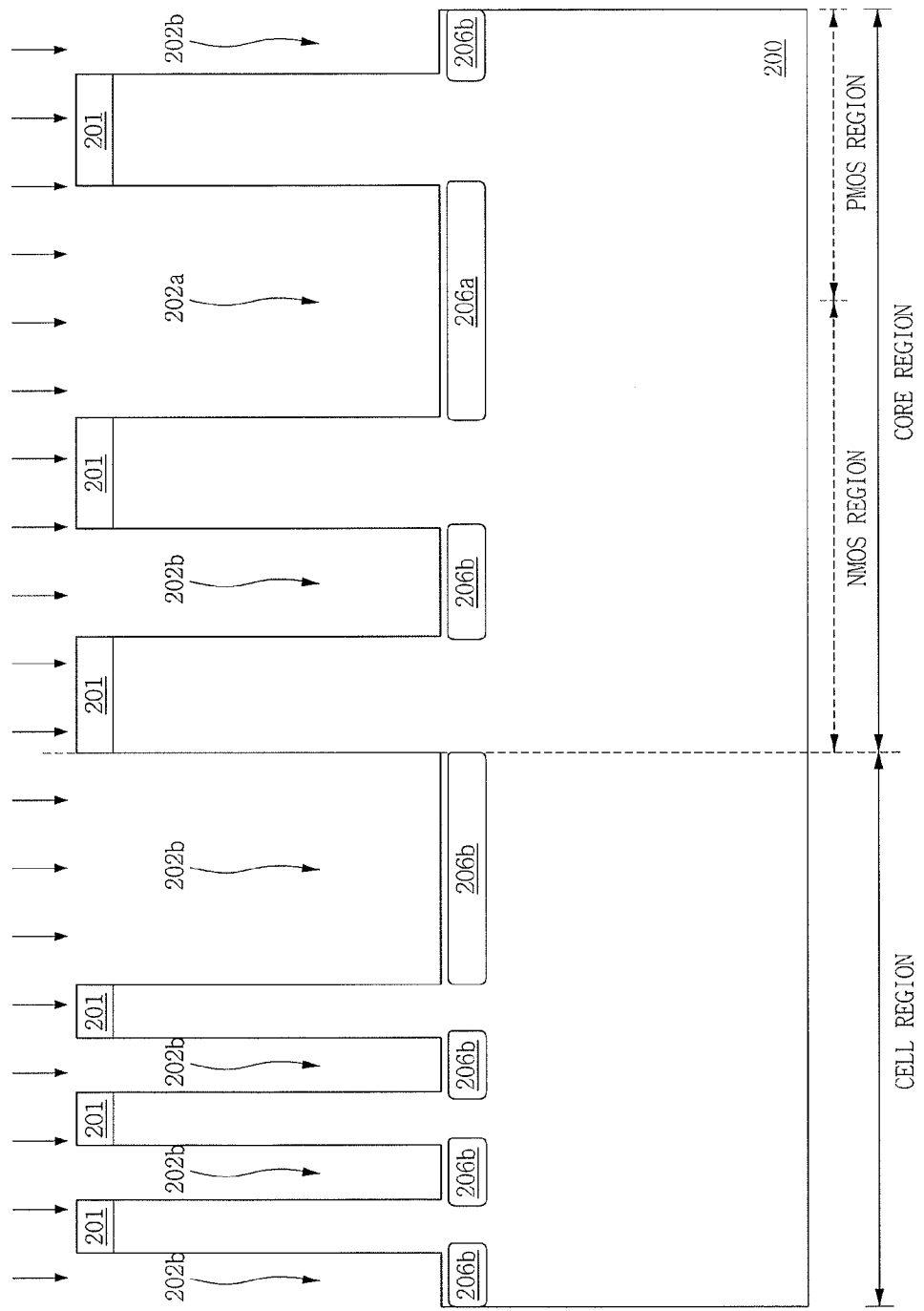

Referring to FIG. 20B, the method may include forming a first diffusion barrier region 206a and a second diffusion barrier region 206b by implanting carbon under the first field trench 202a and the second field trench 202b.

The carbon implantation may be performed without any additional mask. The trench mask 201 used in forming the first and second field trenches 202a and 202b may block the carbon from entering the other portions of the substrate 200. Accordingly, the carbon implantation may be performed self-aligned to the first and second field trenches 202a and 202b, and may not use additional masks or additional process steps.

The carbon may help prevent diffusion of P-type impurities of a P-well defining the NMOS region, or N-type impurities of an N-well defining the PMOS region. Accordingly, the carbon may help prevent counter-doping of the N-well or the P-well, and may help reduce the width of a depletion region between the P-well and the N-well by forming the P-well/N-well junction to be an abrupt junction.

The first and second diffusion barrier regions 206a and 206b may be formed by implanting carbon only, or by implanting carbon and germanium.

Figure 20C:
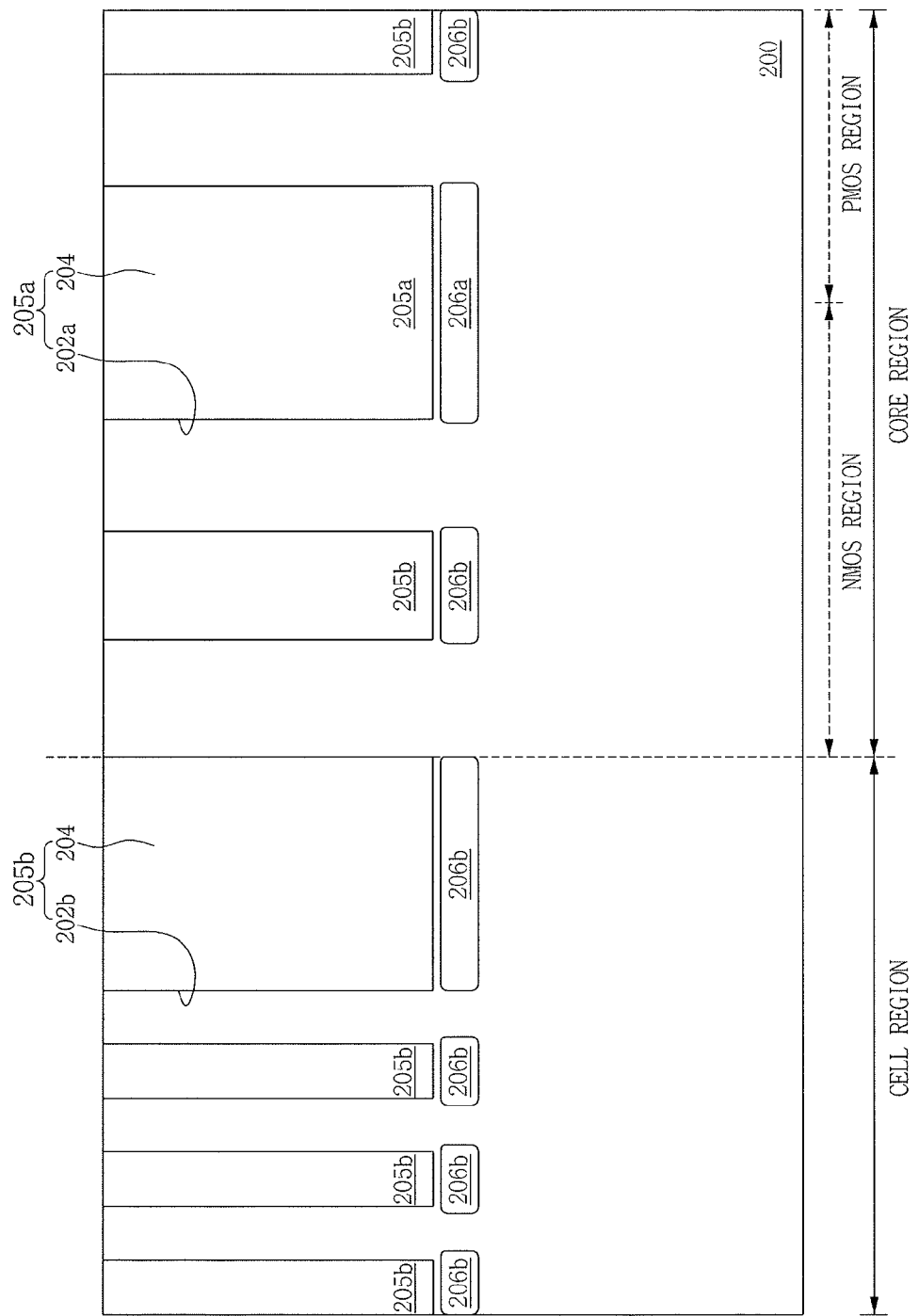

Referring to FIG. 20C, the method may include filling the first and second field trenches 202a and 202b with an insulating layer 204, and forming first and second trench isolation regions 205a and 205b by planarizing the substrate 200.

The insulating layer 204 may include silicon oxide or an insulating material having excellent fluidity.

The planarization of the substrate 200 may be performed by a CMP or an etch-back process. The trench mask 201 may be removed by the planarization process. In an implementation, the trench mask 201 may be removed before filling the first and second field trenches 202a and 202b with an insulating layer 204.

The first and second diffusion barrier regions 206a and 206b containing carbon may help increase the resistance of the substrate region under the first and second field trenches 202a and 202b, which help achieve an effect of increasing the depth of the first and second trench isolation regions 205a and 205b.

Referring to FIG. 20D, the method may include forming a P-well 208 defining the cell region and the NMOS region of the core region, and an N-well 210 defining a PMOS region of the core region, in the substrate 200.

In the method of manufacturing a semiconductor device in accordance with an embodiment, after the first and second diffusion barrier regions 206a and 206b are formed by implanting carbon under the first and second field trenches 202a and 202b, the first and second trench isolation regions 205a and 205b may be formed by filling the first and second field trenches 202a and 202b, and then the P-well 208 and the N-well 210 may be formed in the substrate 200. Due to the first diffusion barrier region 206a, a leakage current between the P-well 208 and the N-well 210 may be reduced, and well isolation characteristics may be enhanced. Due to the second diffusion barrier region 206b, a leakage current generated between neighboring transistors having the same conductivity in the same well may be reduced, and active isolation characteristics may be enhanced.

Figure 21A:
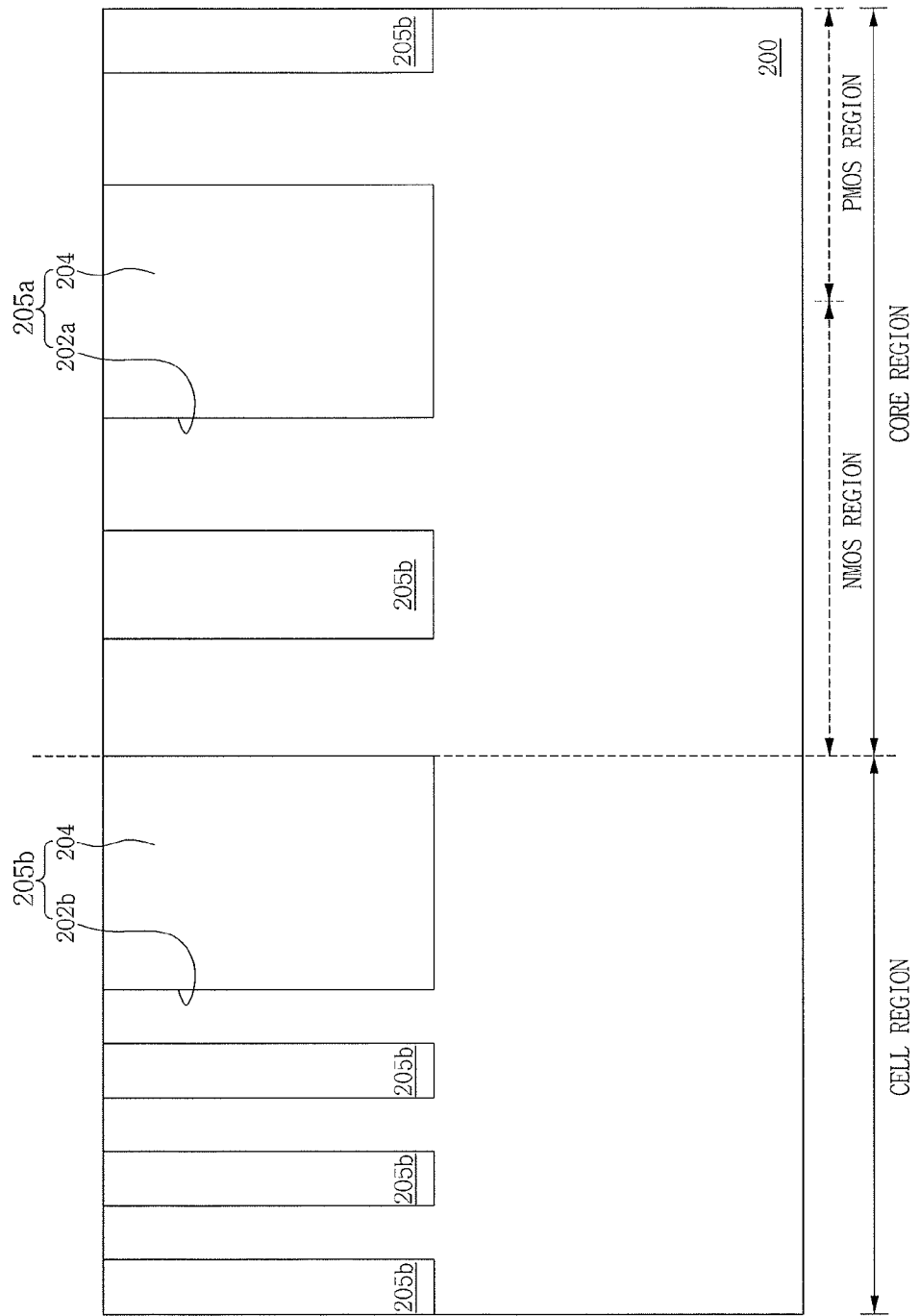
Figure 21B:
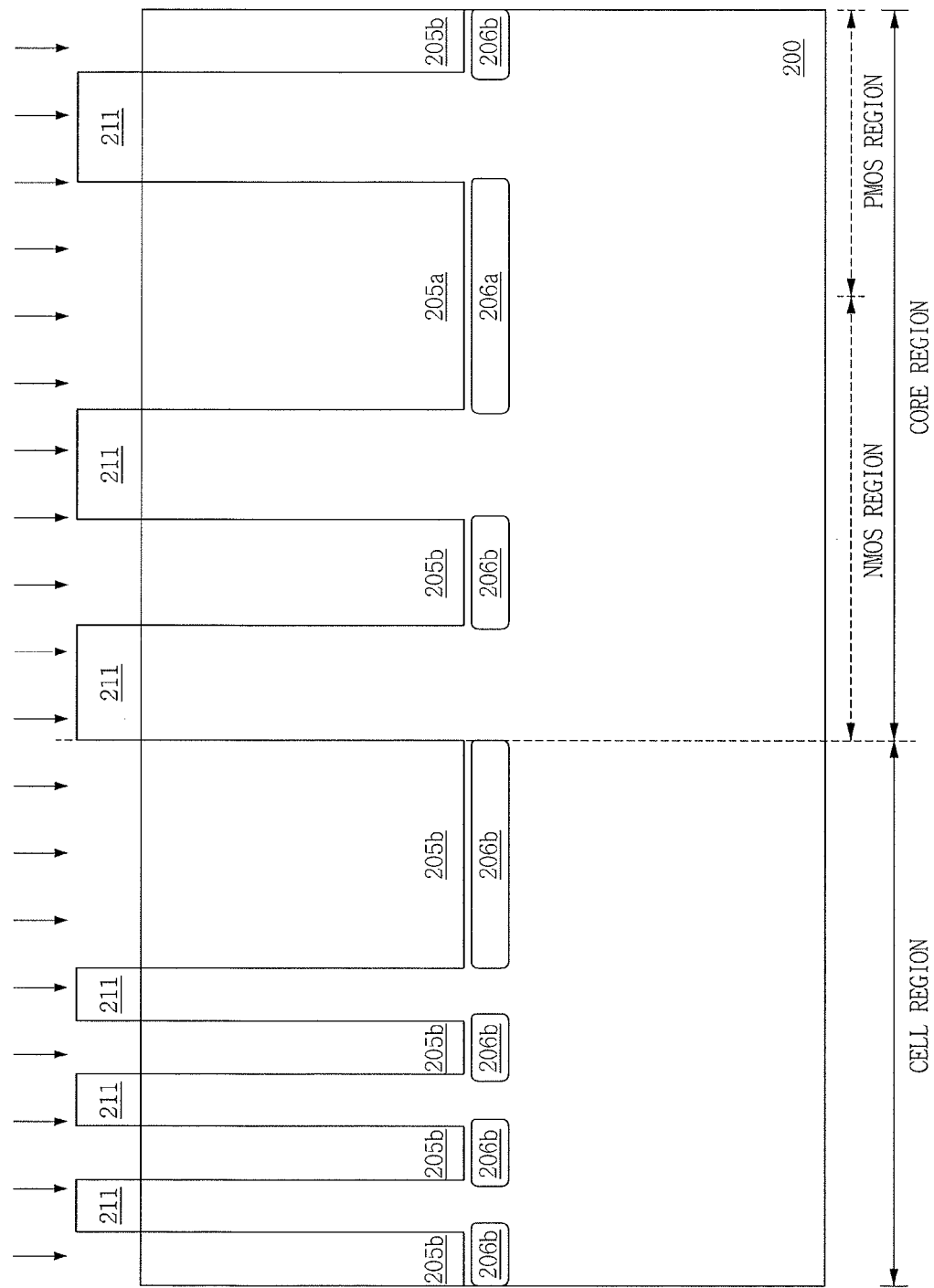

FIGS. 21A to 21C illustrate cross-sectional views of stages in a method of manufacturing a semiconductor device in accordance with an embodiment.

Referring to FIG. 21A, the method of manufacturing a semiconductor device in accordance with an embodiment may include forming first and second field trenches 202a and 202b in a substrate 200 by performing the processes described with reference to FIG. 20A, filling the first and second field trenches 202a and 202b with an insulating layer 204, and forming first and second trench isolation regions 205a and 205b by planarizing the substrate 200.

Referring to FIG. 21B, the method may include forming a mask pattern 211 opening or exposing the first and second trench isolation regions 205a and 205b on the substrate 200, and forming first and second diffusion barrier regions 206a and 206b by implanting carbon under the first and second trench isolation regions 205a and 205b using the mask pattern 211 as an ion-implantation mask.

The mask pattern 211 may be formed of a material that blocks the carbon from entering the other portions of the substrate 200, e.g., photoresist, silicon nitride, or another inorganic material.

The first and second diffusion barrier regions 206a and 206b may be formed by implanting carbon only, or implanting carbon and germanium.

Referring to FIG. 21C, the method may include removing the mask pattern 211, and forming a P-well 208 defining the cell region and the NMOS region of the core region, and an N-well 210 defining a PMOS region of the core region, in the substrate 200.

In the method of manufacturing a semiconductor device in accordance with an embodiment, after forming the first and second trench isolation regions 205a and 205b in the substrate 200, the first and second diffusion barrier regions 206a and 206b may be formed by implanting carbon under the first and second trench isolation regions 205a and 205b, and then the P-well 208 and the N-well 210 may be formed in the substrate 200. Due to the first diffusion barrier region 206a, a leakage current between the P-well 208 and the N-well 210 may be reduced, and well isolation characteristics may be enhanced. Due to the second diffusion barrier region 206b, a leakage current generated between neighboring transistors having the same conductivity in the same well may be reduced, and active isolation characteristics may be enhanced.

Figure 22A:
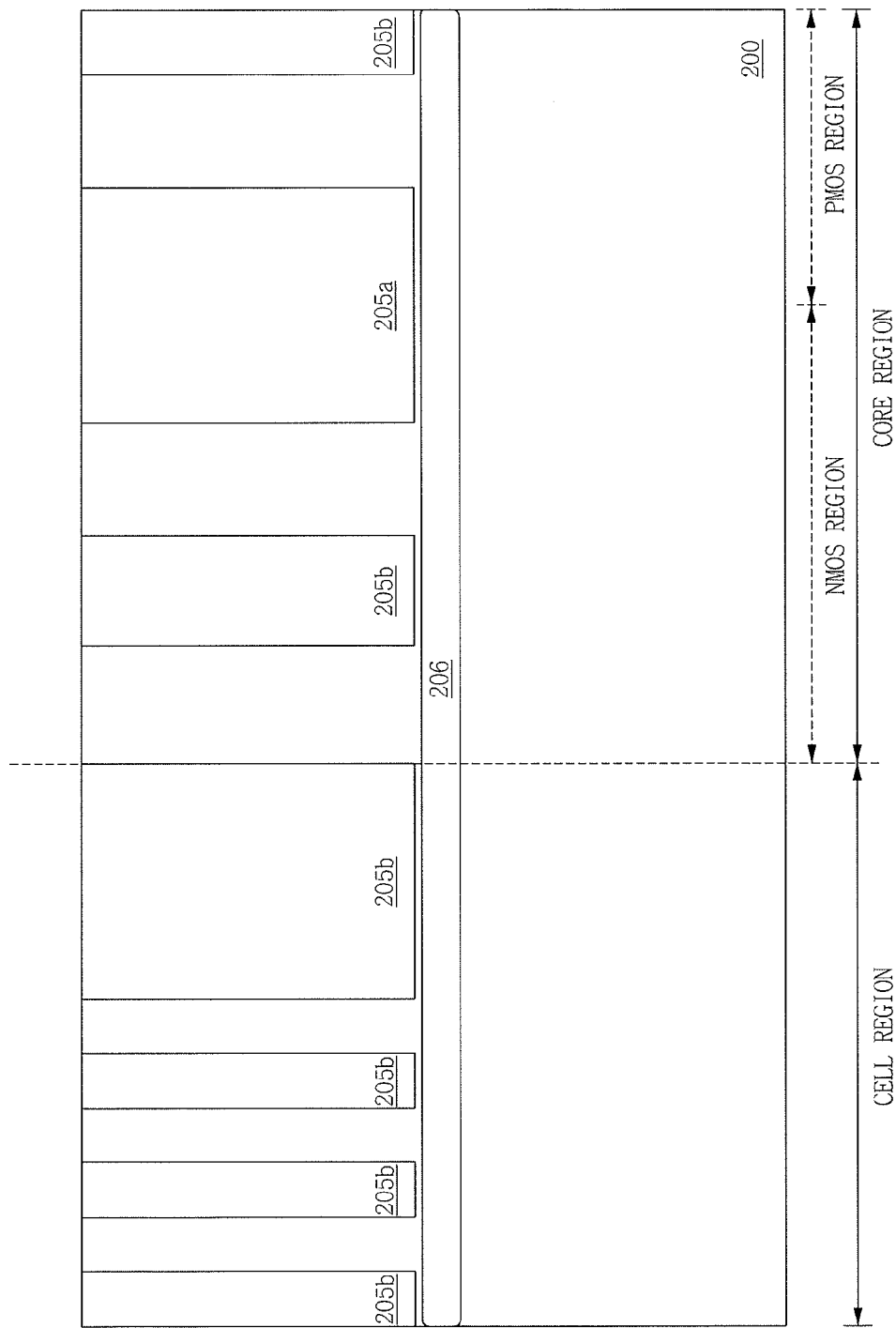
Figure 22B:
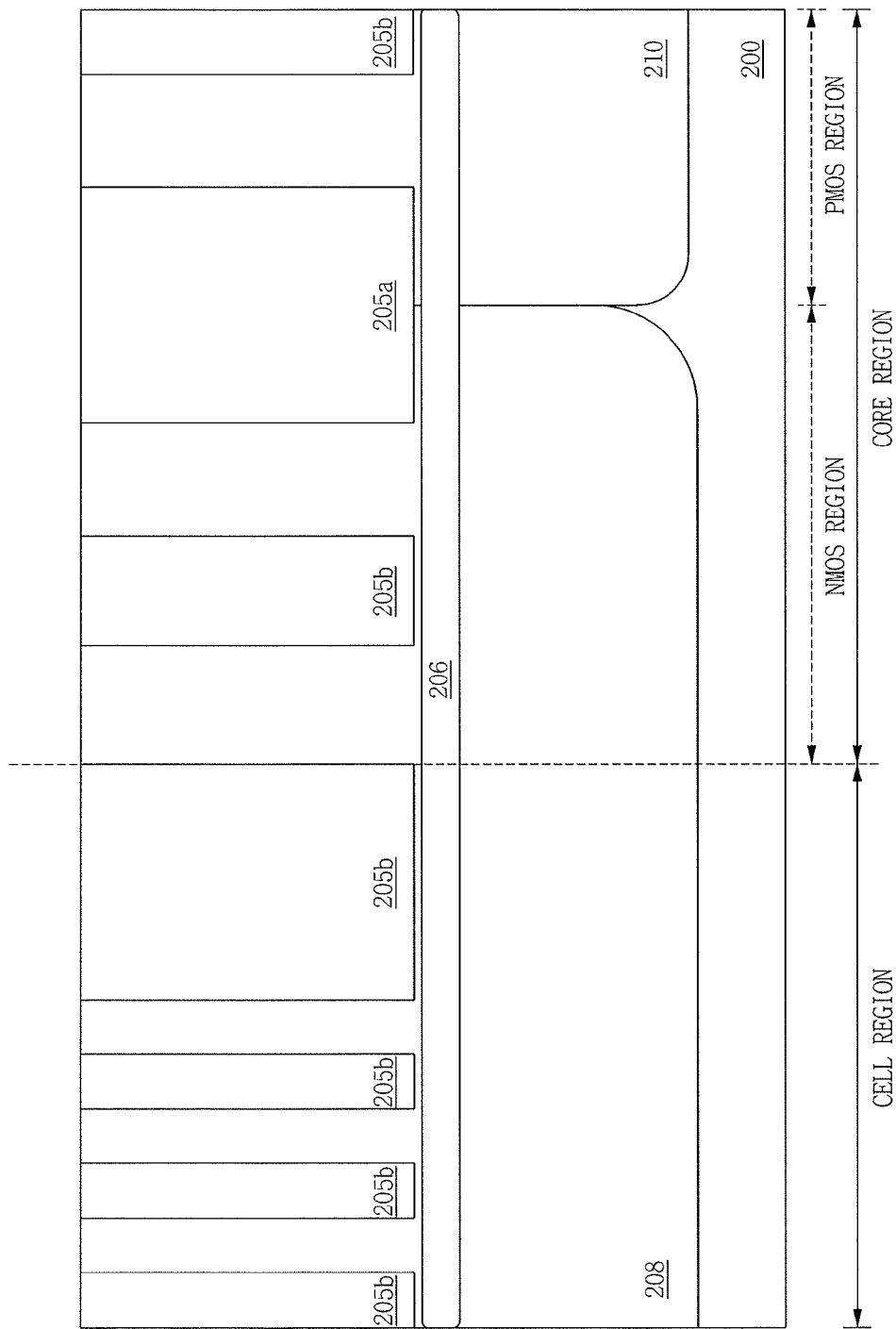

FIGS. 22A and 22B illustrate cross-sectional views of stages in a method of manufacturing a semiconductor device in accordance with an embodiment.

Referring to FIG. 22A, the method of manufacturing a semiconductor device in accordance with an embodiment may include forming first and second trench isolation regions 205a and 205b in a substrate 200 by performing the processes described with reference to FIG. 20A, and forming first and second diffusion barrier regions 206a and 206b under the first and second trench isolation regions 205a and 205b by implanting carbon into the entire surface of the substrate 200.

The first and second diffusion barrier regions 206a and 206b may be formed by implanting carbon into the entire surface of the substrate 200 without any additional mask, in such a way that a projected range (Rp) of ion-implantation is located under the first and second trench isolation regions 205a and 205b.

Referring to FIG. 22B, the method may include forming a P-well 208 (defining the cell region and the NMOS region of the core region), and an N-well 210 (defining a PMOS region of the core region), in the substrate 200.

In the method of manufacturing a semiconductor device in accordance with an embodiment, after forming the first and second trench isolation regions 205a and 205b in the substrate 200, the first and second diffusion barrier regions 206a and 206b may be formed to extend over the entire surface of the substrate 200 under the first and second trench isolation regions 205a and 205b, and then the P-well 208 and the N-well 210 may be formed in the substrate 200. Due to the first diffusion barrier region 206a, a leakage current between the P-well 208 and the N-well 210 may be reduced, and well isolation characteristics may be enhanced. Due to the second diffusion barrier region 206b, a leakage current generated between neighboring transistors having the same conductivity in the same well may be reduced, and active isolation characteristics may be enhanced.

Figure 23A:
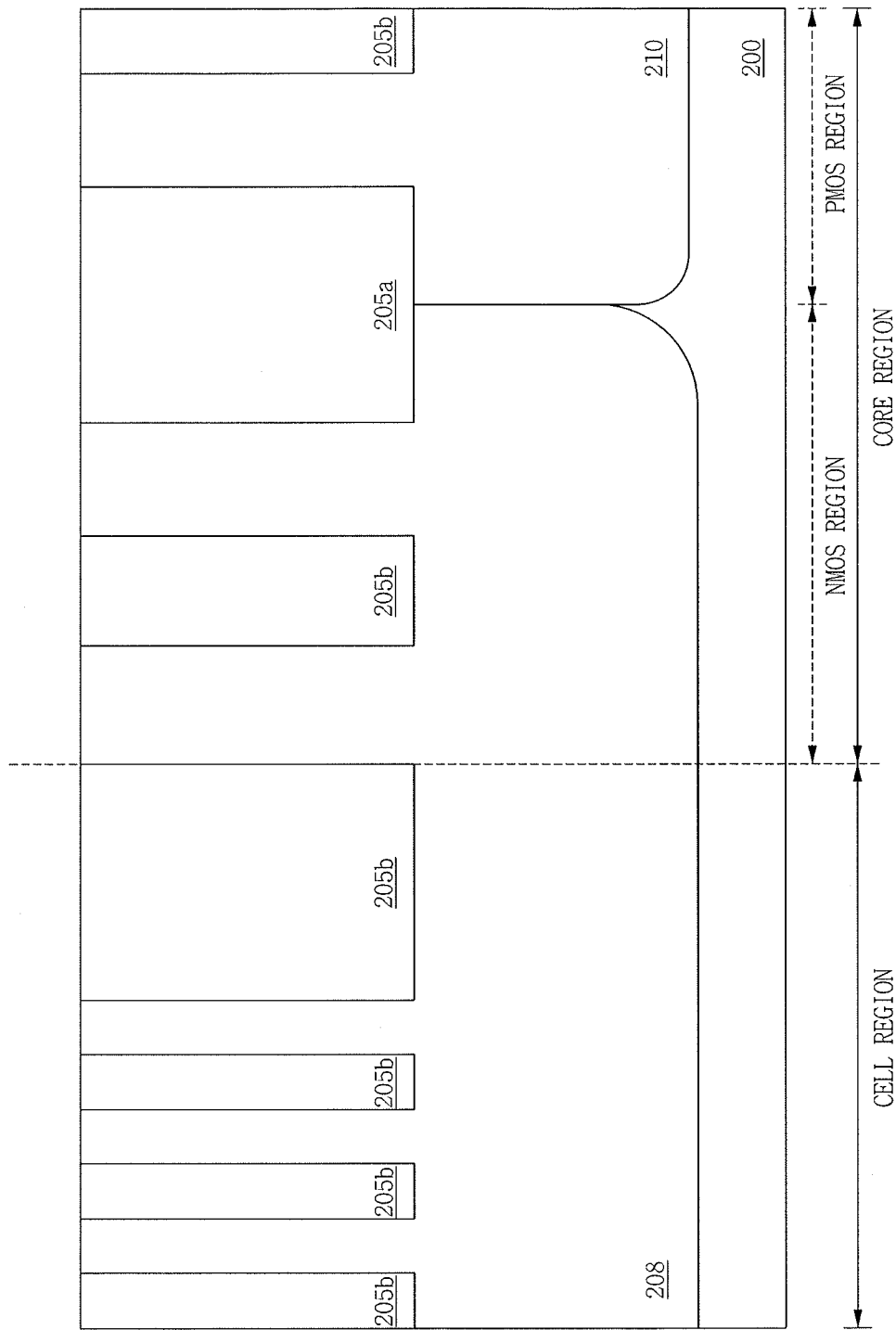

FIGS. 23A and 23B illustrate cross-sectional views of stages in a method of manufacturing a semiconductor device in accordance with an embodiment.

Referring to FIG. 23A, the method of manufacturing a semiconductor device in accordance with an embodiment may include forming first and second trench isolation regions 205a and 205b in a substrate 200 by performing the processes described with reference to FIG. 20A, and forming a P-well 208 defining the cell region and the NMOS region of the core region, and an N-well 210 defining a PMOS region of the core region, in the substrate 200.

Referring to FIG. 23B, the method may include forming a mask pattern 211 opening or exposing the first and second trench isolation regions 205a and 205b on the substrate 200, and forming first and second diffusion barrier regions 206a and 206b by implanting carbon under the first and second trench isolation regions 205a and 205b using the mask pattern 211 as an ion-implantation mask.

The mask pattern 211 may be formed of a material which blocks the carbon from entering the other portions of the substrate 200, e.g., photoresist, silicon nitride, or another inorganic material.

In the method of manufacturing a semiconductor device in accordance with an embodiment, after forming the first and second trench isolation regions 205a and 205b and the P-well 208 and the N-well 210 in the substrate 200, the first and second diffusion barrier regions 206a and 206b may be formed by implanting carbon under the first and second trench isolation regions 205a and 205b. Due to the first diffusion barrier region 206a, a leakage current between the P-well 208 and the N-well 210 may be reduced, and well isolation characteristics may be enhanced. Due to the second diffusion barrier region 206b, a leakage current generated between neighboring transistors having the same conductivity in the same well may be reduced, and active isolation characteristics may be enhanced.

Figure 24:
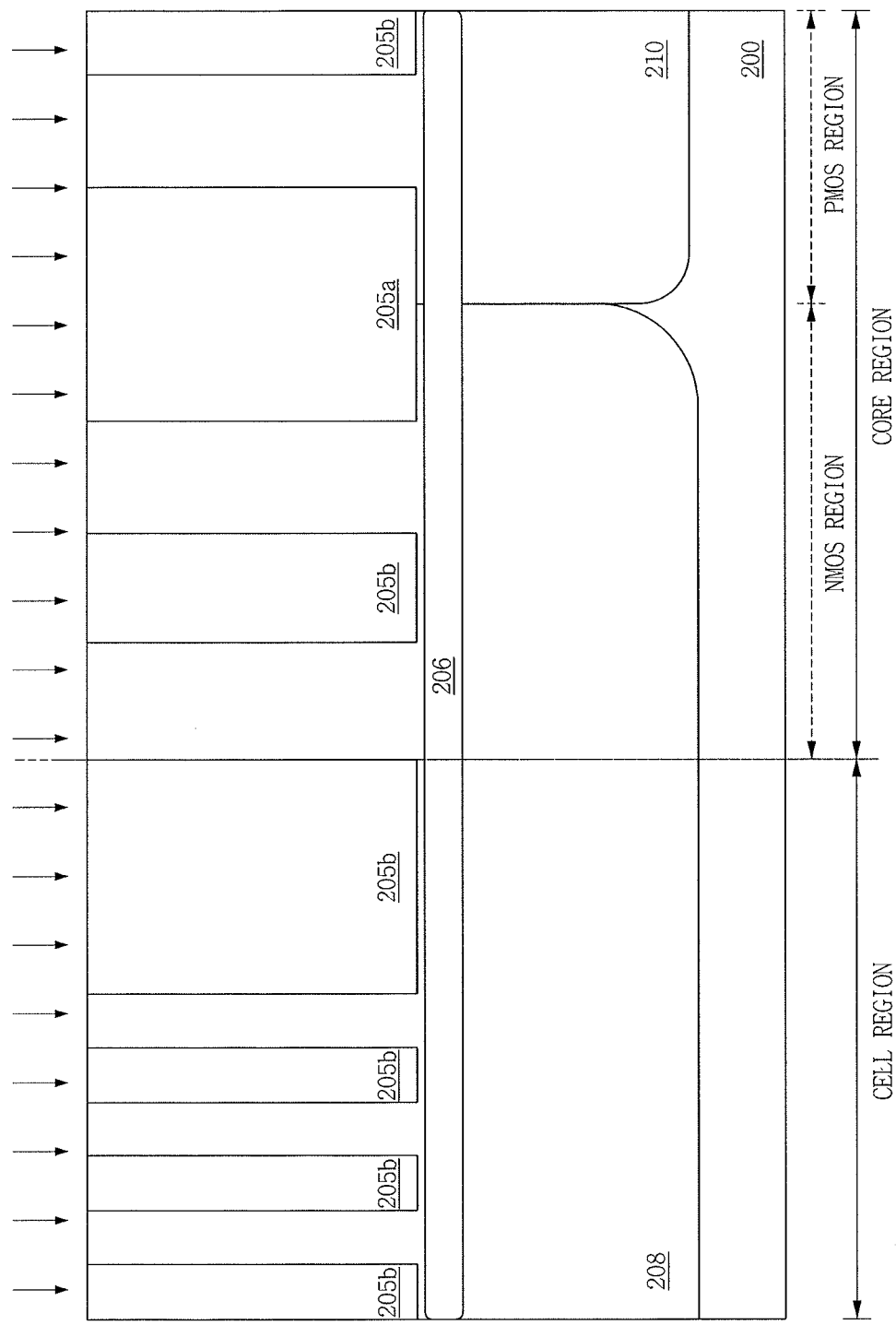

FIG. 24 illustrates a cross-sectional view of a stage in a method of manufacturing a semiconductor device in accordance with an embodiment.

Referring to FIG. 24, the method of manufacturing a semiconductor device in accordance with an embodiment may include forming first and second trench isolation regions 205a and 205b in a substrate 200 by performing the processes described with reference to FIG. 20A, then forming a P-well 208 (defining the cell region and the NMOS region of the core region), and an N-well 210 (defining a PMOS region of the core region), in the substrate 200, and then forming first and second diffusion barrier regions 206a and 206b under the first and second trench isolation regions 205a and 205b by implanting carbon into the entire surface of the substrate 200.

The first and second diffusion barrier regions 206a and 206b may be formed by implanting carbon into the entire surface of the substrate 200 without any additional mask, in such a way that a projected range (Rp) of ion-implantation is located under the first and second trench isolation regions 205a and 205b.

In the method of manufacturing a semiconductor device in accordance with an embodiment, after forming the first and second trench isolation regions 205a and 205b and the P-well 208 and the N-well 210 in the substrate 200, the first and second diffusion barrier regions 206a and 206b may be formed to extend over the entire surface of the substrate 200 under the first and second trench isolation regions 205a and 205b. Due to the first diffusion barrier region 206a, a leakage current between the P-well 208 and the N-well 210 may be reduced, and well isolation characteristics may be enhanced. Due to the second diffusion barrier region 206b, a leakage current generated between neighboring transistors having the same conductivity in the same well may be reduced, and active isolation characteristics may be enhanced.

Figure 25:
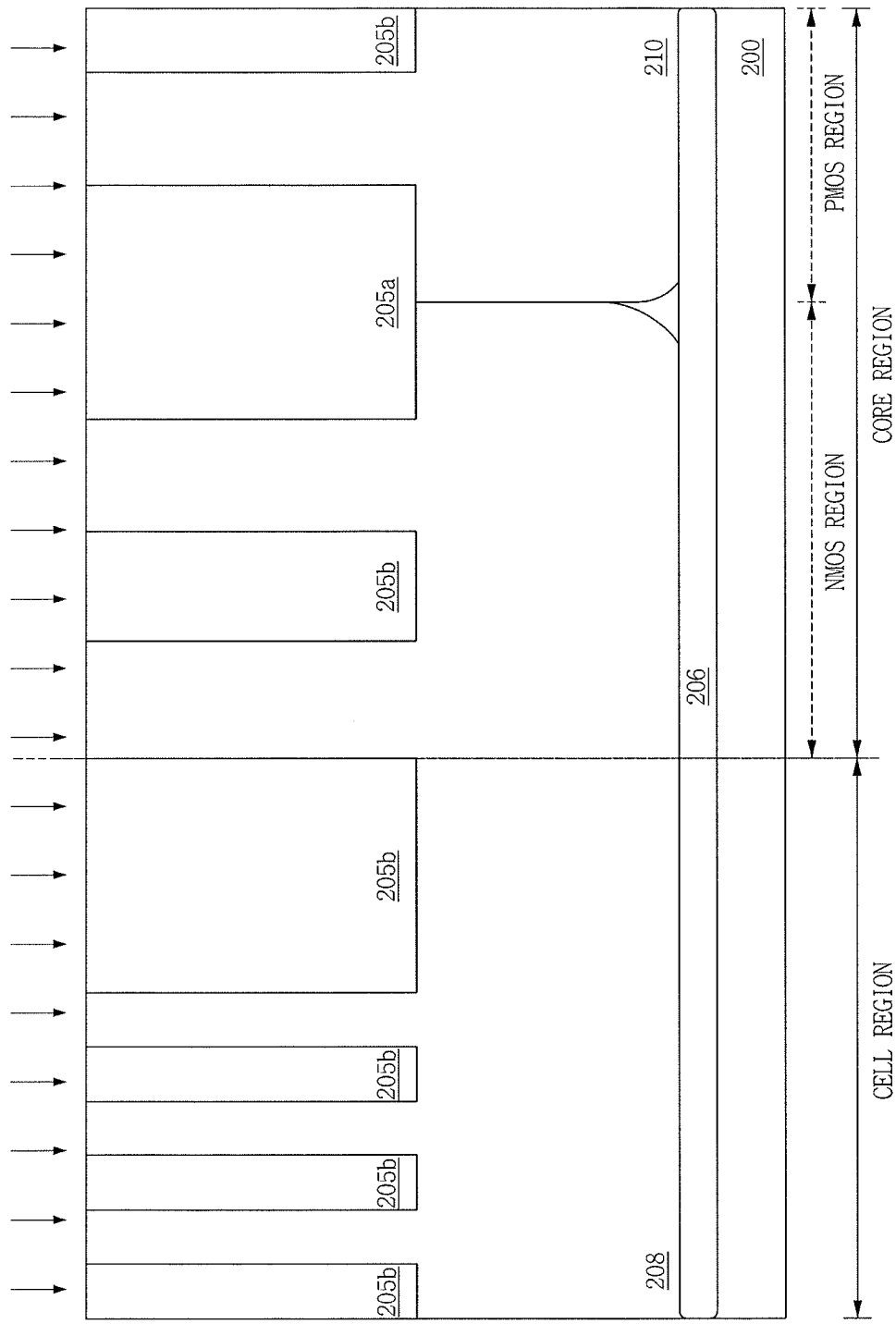

FIG. 25 illustrates a cross-sectional view of a stage in a method of manufacturing a semiconductor device in accordance with an embodiment.

Referring to FIG. 25, the method of manufacturing a semiconductor device in accordance with an embodiment may include forming first and second trench isolation regions 205a and 205b in a substrate 200 by performing the processes described with reference to FIG. 20A, then forming a P-well 208 (defining the cell region and the NMOS region of the core region), and an N-well 210 (defining a PMOS region of the core region) in the substrate 200, and then forming first and second diffusion barrier regions 206a and 206b under the P-well 208 and the N-well 210 by implanting carbon into the entire surface of the substrate 200.

The first and second diffusion barrier regions 206a and 206b may be formed by implanting carbon into the entire surface of the substrate 200 without any additional mask, in such a way that a projected range (Rp) of ion-implantation is located under the P-well 208 and the N-well 210.

In the method of manufacturing a semiconductor device in accordance with an embodiment, after forming the first and second trench isolation regions 205a and 205b and the P-well 208 and the N-well 210 in the substrate 200, the first and second diffusion barrier regions 206a and 206b may be formed to be located under the P-well 208 and the N-well 210. Due to the first diffusion barrier region 206a, a leakage current between the P-well 208 and the N-well 210 may be reduced, and well isolation characteristics may be enhanced. Due to the second diffusion barrier region 206b, a leakage current generated between neighboring transistors having the same conductivity in the same well may be reduced, and active isolation characteristics may be enhanced.

Figure 26:
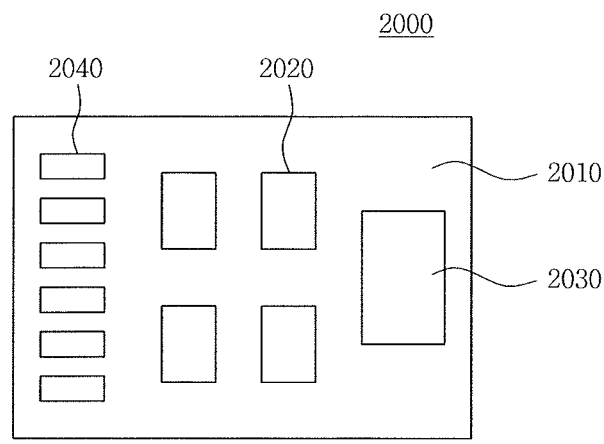
FIG. 26 illustrates a schematic diagram showing a semiconductor module having a semiconductor device in accordance with various embodiments.

FIG. 26 illustrates a block diagram of a semiconductor module including a semiconductor device in accordance with various embodiments.

Referring to FIG. 26, a semiconductor module 2000 may include a control unit 2020, a storage unit 2030, and input/output parts 2040 arranged on a module substrate 2010.

The module substrate 2010 may include a printed circuit board (PCB). The control unit 2020 may include a logic device, e.g., a controller. The storage unit 2030 may include a memory device, e.g., a dynamic random access memory (DRAM), a magnetic RAM (MRAM), or a NAND flash. The input/output parts 2040 may include conductive terminals.

One of the control unit 2020 or the storage unit 2030 may include a semiconductor device in accordance with various embodiments, or a semiconductor device fabricated by a method of manufacturing a semiconductor device in accordance with various embodiments.

The semiconductor module 2000 may be a memory card, e.g., a solid state disk (SSD).

Figure 27:
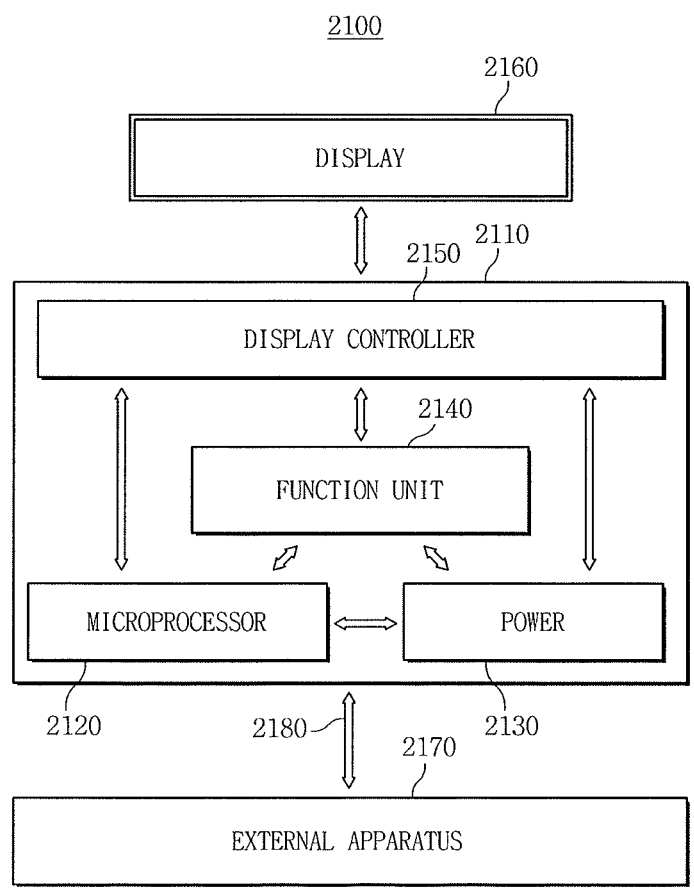
FIG. 27 illustrates a system block diagram having a semiconductor device in accordance with various embodiments.

FIG. 27 illustrates a block diagram of an electronic system including a semiconductor device in accordance with various embodiments.

Referring to FIG. 27, semiconductor devices in accordance with various embodiments may be applied to an electronic system 2100. The electronic system 2100 may include a body 2110, a microprocessor unit 2120, a power unit 2130, a function unit 2140, and/or a display controller unit 2150. The body 2110 may be a system board or a motherboard including a printed circuit board (PCB), or the like. The microprocessor unit 2120, the power unit 2130, the function unit 2140, and the display controller unit 2150 may be mounted or installed on the body 2110.

A display unit 2160 may be arranged on an upper surface or outside of the body 2110. For example, the display unit 2160 may be arranged on a surface of the body 2110 and display an image processed by the display controller unit 2150.

The power unit 2130 may receive a constant voltage from an external battery, or the like, divide the voltage into various levels, and supply those voltages to the microprocessor unit 2120, the function unit 2140, and the display controller unit 2150, or the like. The microprocessor unit 2120 may receive a voltage from the power unit 2130 to control the function unit 2140 and the display unit 2160.

The function unit 2140 may perform various functions of the electronic system 2100. For example, when the electronic system 2100 is a mobile electronic product such as a mobile phone, the function unit 2140 may have several components which perform wireless communication functions such as output of an image to the display unit 2160 or output of a voice to a speaker, by dialing or communication with an external apparatus 2170. If a camera is installed, the function unit 2140 may function as a camera image processor.

In the embodiments, when the electronic system 2100 is connected to a memory card or the like, in order to expand capacity, the function unit 2140 may be a memory card controller. The function unit 2140 may exchange signals with the external apparatus 2170 through a wired or wireless communication unit 2180.

In addition, when the electronic system 2100 needs a universal serial bus (USB) or the like, in order to expand functionality, the function unit 2140 may function as an interface controller. Further, the function unit 2140 may include a mass storage apparatus. At least one of the microprocessor unit 2120 or the function unit 2140 may include a semiconductor device in accordance with various embodiments, or a semiconductor device fabricated by a method of manufacturing a semiconductor device in accordance with various embodiments.

According to various embodiments, by forming a diffusion barrier region containing carbon under a trench isolation regions, there may be an advantageous effect in that leakage current generated between wells having different conductivity types decreases, and the depth of a field trench increases. Accordingly, device isolation characteristics may be enhanced, and a design-rule of the trench isolation region may be reduced.

In addition, device isolation characteristics between neighboring active regions in the same well may be enhanced without degradation of electrical characteristics of a transistor.

The embodiments may provide a method of manufacturing a semiconductor device capable of reducing leakage current between components thereof.

The embodiments also provide a method of manufacturing a semiconductor device capable of enhancing device isolation characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   providing a substrate;
   forming a field trench in the substrate;
   forming a trench isolation region by filling the field trench with an insulating layer; and
   forming a diffusion barrier region under the field trench after forming the trench isolation region,
   wherein the diffusion barrier region includes carbon.

2. The method as claimed in claim 1, wherein the diffusion barrier region further includes germanium.

3. The method as claimed in claim 1, further comprising:
   forming a well region in the substrate after forming the diffusion barrier region.

4. The method as claimed in claim 3, wherein forming the diffusion barrier region includes:
   forming a mask pattern exposing the trench isolation region on the substrate; and
   forming the diffusion barrier region under the trench isolation region, using the mask pattern as an ion-implantation mask.

5. The method as claimed in claim 1, further comprising, before forming the diffusion barrier region:
   forming a well region in the substrate.

6. The method as claimed in claim 5, wherein the diffusion barrier region is formed under the well region.

7. The method as claimed in claim 1, wherein the diffusion barrier region is formed to extend over the entire surface of the substrate.

8. A method of manufacturing a semiconductor device, the method comprising:
   providing a substrate including an NMOS region and a PMOS region;
   forming a first field trench and second field trenches in the substrate corresponding to between the NMOS region and the PMOS region, and corresponding to the NMOS region and the PMOS region;
   forming a first trench isolation region and second trench isolation regions by filling the first field trench and the second field trenches with an insulating layer;
   forming a P-well and an N-well in the substrate corresponding to the NMOS region and the PMOS region; and
   forming a first diffusion barrier region under the first field trench,
   wherein the first diffusion barrier region includes carbon.

9. The method as claimed in claim 8, further comprising forming second diffusion barrier regions under the second field trenches simultaneously with the forming the first diffusion barrier region under the first field trench.

10. The method as claimed in claim 9, wherein the second diffusion barrier region includes carbon.

11. The method as claimed in claim 8, wherein:
   forming the first trench isolation region and second trench isolation regions; and
   forming the P-well and N-well are performed after forming the first diffusion barrier region.

12. The method as claimed in claim 8, wherein:
   forming the first trench isolation region and second trench isolation regions is performed before forming the first diffusion barrier region; and
   forming the P-well and N-well is performed after forming the first diffusion barrier region.

13. The method as claimed in claim 8, wherein:
   forming the first trench isolation region and second trench isolation regions; and
   forming the P-well and N-well are performed before forming the first diffusion barrier region.

14. The method as claimed in claim 8, wherein the first diffusion barrier region is formed to extend over an entire surface of the substrate.

15. A method of manufacturing a semiconductor device, the method comprising:
   providing a substrate, the substrate including a first region and a second region;
   forming a first field trench in the first region of the substrate;
   forming a second field trench in the second region of the substrate;
   forming a first diffusion barrier region under the first field trench;
   forming a second diffusion barrier region under the second field trench simultaneously with the forming the first diffusion barrier region under the first field trench;
   forming a first trench isolation region and a second trench isolation region by filling the first field trench and the second field trench with an insulating layer; and
   forming a boundary region under the first trench isolation region and between an N-well and a P-well,
   wherein a width of the first trench isolation region is greater than a width of the second trench isolation region, and
   wherein an upper portion of the boundary region is in contact with the first diffusion barrier region.

16. The method as claimed in claim 15, wherein the first and second diffusion barrier regions includes carbon.

17. The method as claimed in claim 16, wherein the first and second diffusion barrier regions further include germanium.

18. The method as claimed in claim 15, wherein the second diffusion barrier region is in contact with the P-well.

19. The method as claimed in claim 18, wherein the second diffusion barrier region is not in contact with the N-well.

20. The method as claimed in claim 8, wherein a boundary region between the P-well and the N-well is in contact with the first diffusion barrier region.

* * * * *